US009245847B2

(12) United States Patent
Matsumoto et al.

(10) Patent No.: US 9,245,847 B2
(45) Date of Patent: Jan. 26, 2016

(54) METHOD FOR MANUFACTURING SEMICONDUCTOR DEVICE FOR FORMING METAL ELEMENT-CONTAINING LAYER ON INSULATING LAYER IN WHICH CONCAVE PORTION IS FORMED, SEMICONDUCTOR DEVICE INCLUDING INSULATING LAYER IN WHICH CONCAVE PORTION IS FORMED, AND SEMICONDUCTOR LAYER ON INSULATING LAYER IN WHICH CONCAVE PORTION IS FORMED

(71) Applicant: TOKYO ELECTRON LIMITED, Tokyo (JP)

(72) Inventors: Kenji Matsumoto, Nirasaki (JP); Tatsufumi Hamada, Nirasaki (JP); Kaoru Maekawa, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/510,388

(22) Filed: Oct. 9, 2014

(65) Prior Publication Data
US 2015/0021775 A1 Jan. 22, 2015

Related U.S. Application Data

(63) Continuation of application No. PCT/JP2013/002296, filed on Apr. 2, 2013.

(30) Foreign Application Priority Data

Apr. 11, 2012 (JP) ................................ 2012-090393

(51) Int. Cl.
*H01L 23/532* (2006.01)
*H01L 21/02* (2006.01)
(Continued)

(52) U.S. Cl.
CPC ........ *H01L 23/53238* (2013.01); *C23C 16/045* (2013.01); *C23C 16/06* (2013.01);
(Continued)

(58) Field of Classification Search
CPC .................. H01L 23/53238; H01L 21/02164; H01L 21/76846
See application file for complete search history.

(56) References Cited

U.S. PATENT DOCUMENTS 5,130,274 A * 7/1992 Harper et al. ................. 438/624
7,932,176 B2 * 4/2011 Gordon et al. ............... 438/627
(Continued)

FOREIGN PATENT DOCUMENTS

JP 2005-277390 A 10/2005
JP 2007-149813 A 6/2007
(Continued)

OTHER PUBLICATIONS

PCT Application No. PCT/JP2013/002296, International Search Report Dated Jul. 9, 2013, two (2) pages.

*Primary Examiner* — William Coleman
(74) *Attorney, Agent, or Firm* — Nath, Goldberg & Meyer; Jerald L. Meyer

(57) ABSTRACT

A method for manufacturing a semiconductor device for forming a metal element-containing layer on an insulating layer in which a concave portion is formed, includes: forming an oxide layer including mainly an oxide of the metal element on the insulating layer including the concave portion; and forming a silicate layer including mainly a silicate of the metal element by making the oxide layer into silicate by annealing under a reducing atmosphere.

44 Claims, 14 Drawing Sheets

(51) Int. Cl.
*H01L 21/3105* (2006.01)
*H01L 21/768* (2006.01)
*C23C 16/06* (2006.01)
*C23C 16/40* (2006.01)
*C23C 16/455* (2006.01)
*C23C 16/46* (2006.01)
*C23C 16/50* (2006.01)
*H01L 21/67* (2006.01)
*C23C 16/04* (2006.01)
*C23C 16/56* (2006.01)

(52) U.S. Cl.
CPC .............. *C23C 16/40* (2013.01); *C23C 16/401* (2013.01); *C23C 16/45525* (2013.01); *C23C 16/45544* (2013.01); *C23C 16/46* (2013.01); *C23C 16/50* (2013.01); *C23C 16/56* (2013.01); *H01L 21/0228* (2013.01); *H01L 21/02142* (2013.01); *H01L 21/02164* (2013.01); *H01L 21/02175* (2013.01); *H01L 21/02271* (2013.01); *H01L 21/02274* (2013.01); *H01L 21/02321* (2013.01); *H01L 21/02337* (2013.01); *H01L 21/3105* (2013.01); *H01L 21/67207* (2013.01); *H01L 21/76814* (2013.01); *H01L 21/76825* (2013.01); *H01L 21/76826* (2013.01); *H01L 21/76843* (2013.01); *H01L 21/76846* (2013.01); *H01L 21/76855* (2013.01); *H01L 21/76856* (2013.01); *H01L 21/76864* (2013.01); *H01L 2924/0002* (2013.01)

(56) References Cited

U.S. PATENT DOCUMENTS

| | | | | |
|---|---|---|---|---|
| 7,956,465 | B2 * | 6/2011 | Huang | 257/751 |
| 8,372,745 | B2 * | 2/2013 | Koike | 438/653 |
| 8,492,987 | B2 * | 7/2013 | Nuhfer et al. | 315/246 |
| 8,508,018 | B2 * | 8/2013 | Akolkar et al. | 257/508 |
| 8,734,902 | B2 * | 5/2014 | Thompson et al. | 427/252 |
| 8,841,770 | B2 * | 9/2014 | Cabral et al. | 257/751 |
| 2010/0025852 | A1 * | 2/2010 | Ueki et al. | 257/761 |

FOREIGN PATENT DOCUMENTS

| | | |
|---|---|---|
| JP | 2008-218659 A | 9/2008 |
| WO | 2012/060428 A1 | 5/2012 |

* cited by examiner

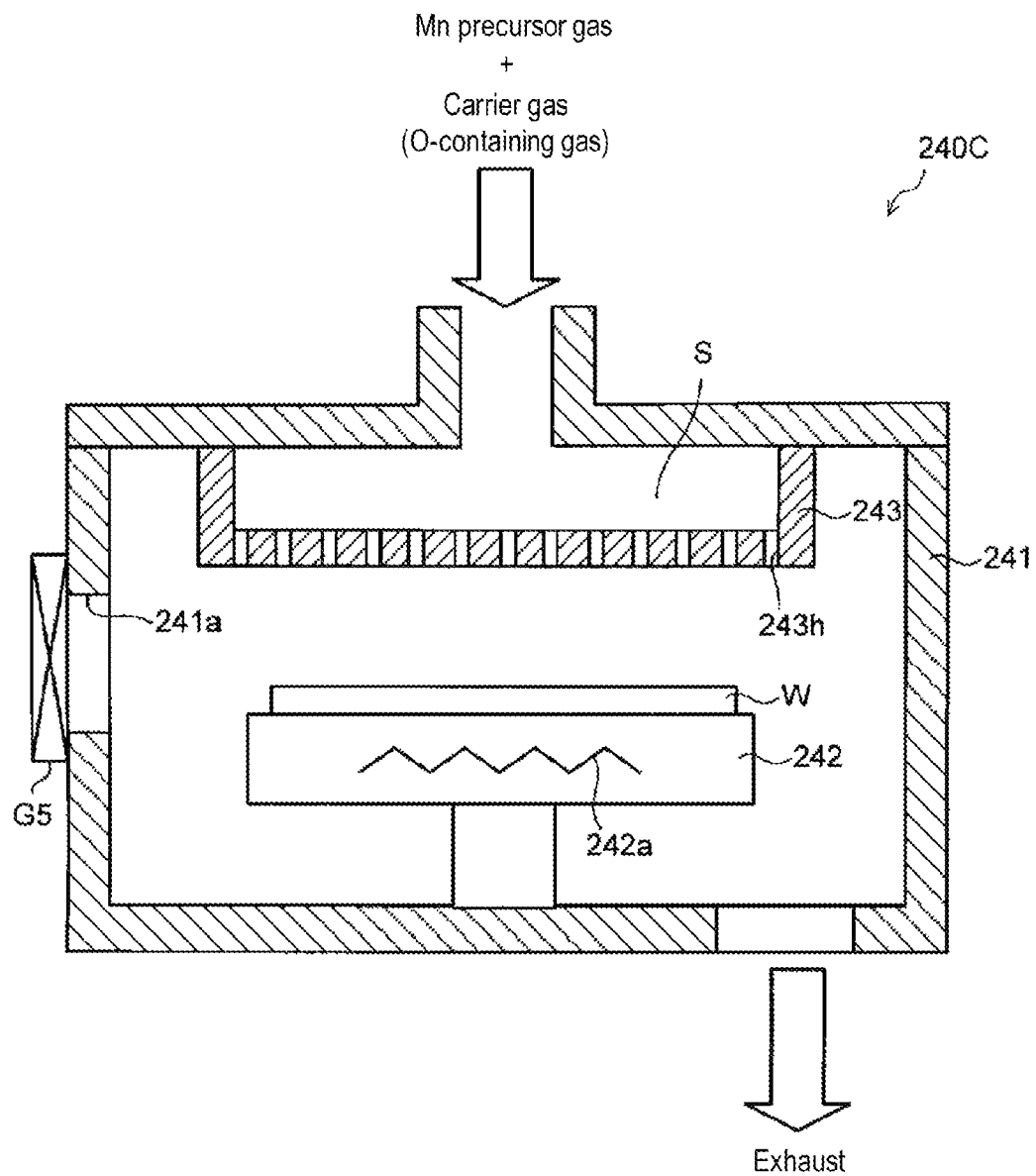

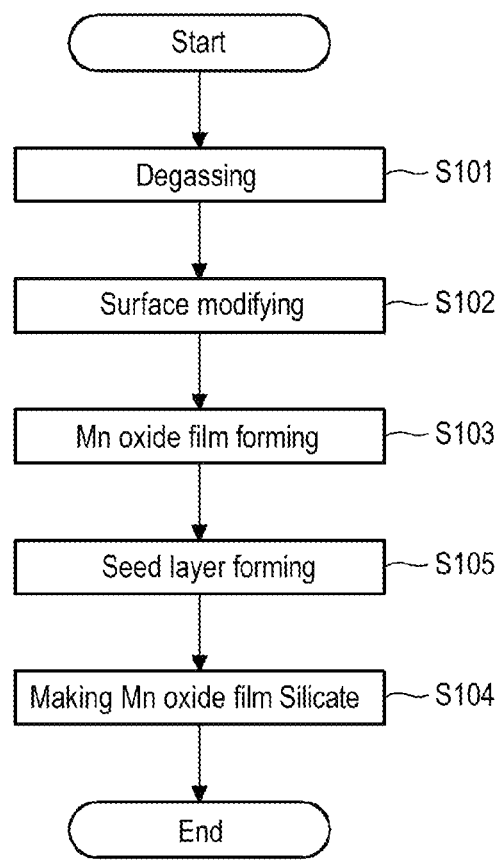

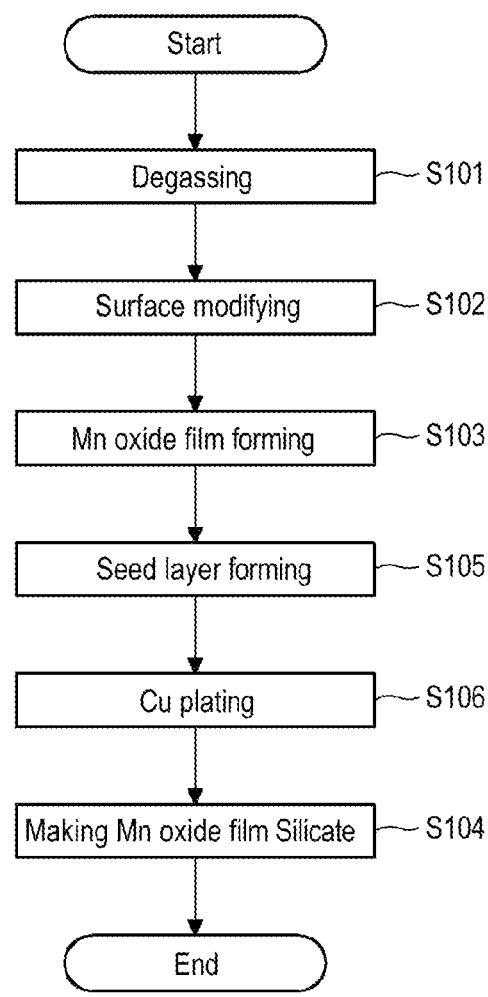

METHOD FOR MANUFACTURING SEMICONDUCTOR DEVICE FOR FORMING METAL ELEMENT-CONTAINING LAYER ON INSULATING LAYER IN WHICH CONCAVE PORTION IS FORMED, SEMICONDUCTOR DEVICE INCLUDING INSULATING LAYER IN WHICH CONCAVE PORTION IS FORMED, AND SEMICONDUCTOR LAYER ON INSULATING LAYER IN WHICH CONCAVE PORTION IS FORMED

CROSS-REFERENCE TO RELATED APPLICATIONS

This application is a Continuation Application of PCT International Application No. PCT/JP2013/002296, filed Apr. 2, 2013, which claimed the benefit of Japanese Patent Application No. 2012-090393, filed Apr. 11, 2012, the entire content of each of which is hereby incorporated by reference.

TECHNICAL FIELD

The present disclosure relates to a method for manufacturing a semiconductor device, a semiconductor device, and a semiconductor manufacturing apparatus.

BACKGROUND

Semiconductor devices using copper (Cu) having low resistance as a material for wirings and via conductors have been manufactured. However, the use of Cu requires a bather layer to prevent Cu diffusion. While tantalum (Ta) or a tantalum nitride film (TaN) is typically used for the barrier layer, a self-forming barrier layer using a CuMn alloy instead of Ta and TaN has been recently proposed.

Since a CuMn alloy formed as a film serves as a seed layer, a Cu-plated layer can be directly formed on the CuMn alloy. By annealing after the plating, the Cu-plated layer reacts with an underlying $SiO_2$ layer (an interlayer insulating layer) or water contained therein to form a MnSixOy layer (where x and y are any positive number) or a MnOx layer (where x is any positive number) in a self-aligning manner at a boundary between the $SiO_2$ layer and the CuMn alloy. Since the MnSixOy layer (silicate of Mn element: Mn silicate layer) and the MnOx (Mn oxide layer) become Cu barrier layers, it is possible to reduce the number of manufacturing processes. Manganese oxides may include MnO, $Mn_3O_4$, $Mn_2O_3$, $MnO_2$ and the like depending on the valence of Mn, which are herein collectively referred to as MnOx (Mn oxide).

In recent years, with high integration and high miniaturization of semiconductor devices, as the distance between wirings becomes smaller, electric capacitance between adjacent wirings (inter-wiring capacitance) is being increased. This causes a phenomenon in which signals transmitted through wirings become slower (signal delay). To avoid this signal delay, a material having a smaller relative dielectric constant (Low-k material) is being used for the interlayer insulating layer. This is because a smaller relative dielectric constant provides smaller inter-wiring capacitance. SiOC, SiOCH and the like containing organic groups such as methyl groups and the like has been raised as proper Low-k materials and there is a trend that C (carbon) is contained in the interlayer insulating layer.

In comparison between the Mn silicate layer and the Mn oxide layer as barrier layers, the Mn silicate layer is considered to be more desirable from the following three viewpoints. 1) The Mn silicate layer is more amorphous and hence has a smaller crystal grain boundary (higher diffusion ability of Cu or O) than the Mn oxide layer, which can result in the improvement of the barrier property. 2) When the Mn oxide layer becomes a silicate by reaction with silicon oxide (SiOx) of the interlayer insulating layer, a volume (film thickness) thereof is reduced. Therefore, since a sectional area of a Cu wiring or a via conductor formed on the surface of the Mn silicate layer increases as much as the reduced amount, the Cu wiring or the via conductor can have low resistance. 3) Since the Mn oxide may take a plurality of states, such as MnO, $Mn_3O_4$, $Mn_2O_3$, $MnO_2$ and the like, this is unstable because of its change in density and volume. In contrast, the Mn silicate is chemically stable. Once the Mn silicate is formed, since its state is more stable than the Mn oxide, aging degradation of semiconductor devices may be reduced. However, conventionally, it is uncertain which one of the Mn silicate layer and the Mn oxide layer will be formed on the interlayer insulating layer using a Low-k material, which resulted in difficulty in reliably forming the Mn silicate layer on the interlayer insulating layer.

SUMMARY

The present disclosure provides a method for manufacturing a semiconductor device, which is capable of forming a silicate layer on a surface of an insulating layer having a low relative dielectric constant with high efficiency, a semiconductor device, and a semiconductor manufacturing apparatus.

According to one embodiment of the present disclosure, there is provided a method for manufacturing a semiconductor device for forming a metal element-containing layer on an insulating layer in which a concave portion is formed, including: forming an oxide layer including mainly an oxide of the metal element on the insulating layer including the concave portion; and forming a silicate layer including mainly a silicate of the metal element by making the oxide layer silicate by annealing under a reducing atmosphere.

According to another embodiment of the present disclosure, there is provided a semiconductor device including an insulating layer in which a concave portion is formed, and a metal element-containing layer formed on the insulating layer, in which an oxide layer including mainly an oxide of the metal element is formed on the insulating layer including the concave portion, and a silicate layer including mainly a silicate of the metal element is formed by making the oxide layer silicate by annealing under a reducing atmosphere.

According to another embodiment of the present disclosure, there is provided a semiconductor manufacturing apparatus for forming a metal element-containing layer on an insulating layer in which a concave portion is formed, including: a first processing chamber in which an oxide layer including mainly an oxide of the metal element is formed on the insulating layer including the concave portion; and a second processing chamber in which a silicate layer including mainly a silicate of the metal element is formed by making the oxide layer silicate by annealing under a reducing atmosphere.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a schematic sectional view of a processing chamber.

FIG. 5B is a flow chart illustrating a process flow of a semiconductor manufacturing apparatus.

FIG. 5C is a flow chart illustrating a process flow of a semiconductor manufacturing apparatus.

DETAILED DESCRIPTION

A semiconductor device, a method for manufacturing a semiconductor device, and a semiconductor manufacturing apparatus according to embodiments will now be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

(Embodiments)

Figure 1:
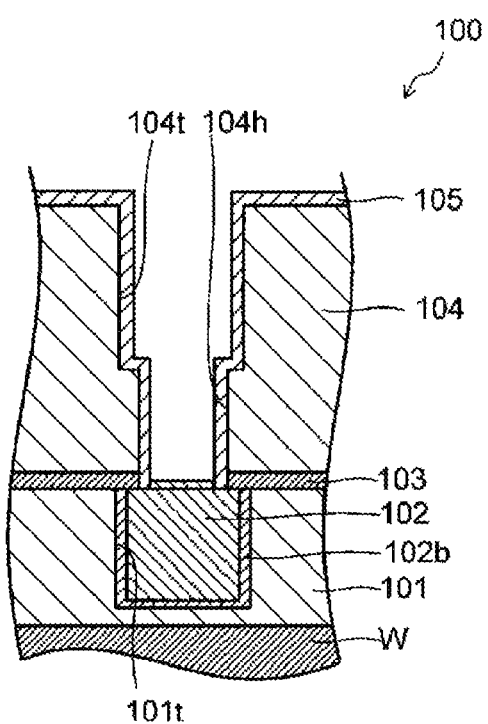
FIG. 1 is a sectional view of a semiconductor device according to an embodiment.

FIG. 1 is a sectional view of a semiconductor device 100 according to an embodiment. A transistor peripheral circuit (FEOL) is not shown in the specification, including FIG. 1. The semiconductor device 100 is formed in a semiconductor substrate W (hereinafter referred to as a wafer W). The semiconductor device 100 includes an interlayer insulating layer 101, a wiring 102 embedded in a trench (wiring groove) 101t of the interlayer insulating layer 101, a barrier layer 102b interposed between the interlayer insulating layer 101 and the wiring 102, a diffusion prevention layer 103 formed on the interlayer insulating layer 101 and a portion of the wiring 102, an interlayer insulating layer 104 formed on the diffusion prevention layer 103 and having a via hole 104h and a trench (wiring groove) 104t formed therein, and a silicate layer 105 (hereinafter referred to as a Mn silicate layer 105) formed on inner surfaces of the via hole 104h and the trench (wiring groove) 104t and containing $MnSi_xO_y$ (x and y are any positive number) as a principal component.

Examples of the interlayer insulating layers 101 and 104 may include a $SiO_2$ layer, a SiOF layer, a TEOS layer, a Low-k layer and the like. In order to reduce cross-talk between wirings, the interlayer insulating layers 101 and 104 are preferably a Low-k layer. In this embodiment, the interlayer insulating layers 101 and 104 are preferably a Low-k layer. Examples of materials for the Low-k layer may include SiOH, SiOC, SiOCH and the like, which commonly contain a silicon oxide (SiOx) ingredient. Further, in order to further reduce a relative dielectric constant, these materials may have a porous structure including a plurality of pores.

The wiring 102 is a copper (Cu) wiring buried by a damascene process in the trench 101t formed by selectively etching the interlayer insulating layer 101.

The barrier layer 102b interposed between the interlayer insulating layer 101 and the wiring 102 is used to prevent Cu in the wiring 102 from being diffused into the interlayer insulating layer 101 and/or the interlayer insulating layer 104. The barrier layer 102b is made of material such as, for example, tantalum (Ta), tantalum nitride (TaN), titanium (Ti), titanium nitride (TiN), MnOx, MnSixOy or the like.

The diffusion prevention layer 103 is formed on the interlayer insulating layer 101 and a portion of the wiring 102. The diffusion prevention layer 103 is used to prevent Cu in the wiring 102 from being diffused into the interlayer insulating layer 104 and/or the interlayer insulating layer 101. The diffusion prevention layer 103 is made of material such as, for example, silicon nitride ($Si_3N_4$), silicon carbide (SiC), silicon carbon nitride (SiCN), silicon oxynitride (SiON), MnOx, MnSixOy or the like. The diffusion prevention layer 103 also acts as an etching stop layer when the via hole 104h and the trench (wiring groove) 104t are formed in the interlayer insulating layer 104.

The Mn silicate layer 105 is formed on the inner surfaces of the via hole 104h and the trench 104t formed in the interlayer insulating layer 104. The Mn silicate layer 105 includes mainly a Mn silicate (MnSixOy) and acts as a Cu diffusion prevention layer (barrier layer).

(Apparatus for Manufacturing Semiconductor Device 100)

Figure 2:
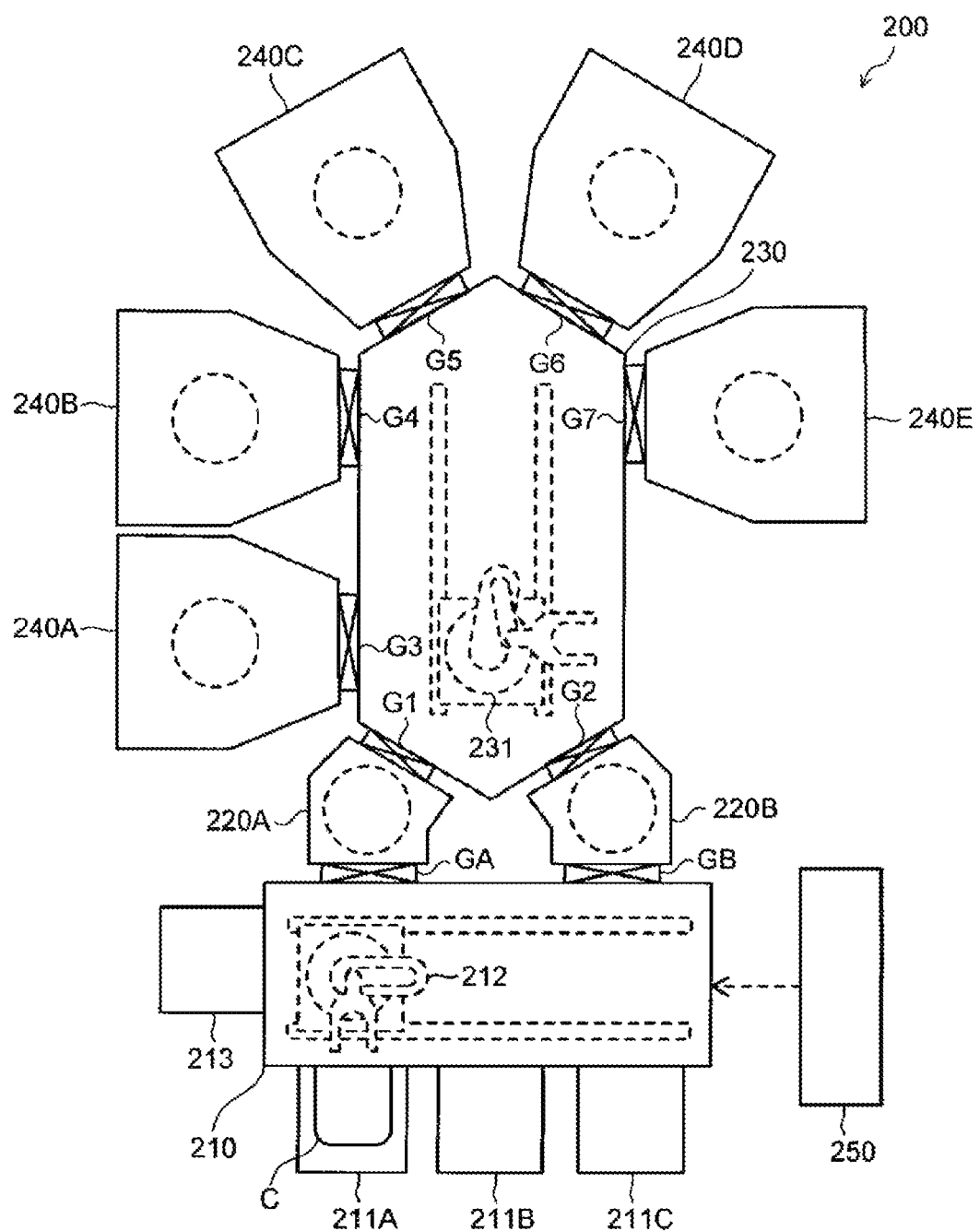
FIG. 2 is a view schematically illustrating the configuration of a semiconductor manufacturing apparatus according to an embodiment.

FIG. 2 is a view schematically illustrating the configuration of a semiconductor manufacturing apparatus 200 for manufacturing the semiconductor device 100. The configuration of the semiconductor manufacturing apparatus 200 will now be described with reference to FIG. 2. The semiconductor manufacturing apparatus 200 includes a loader module 210, load lock chambers 220A and 220B, a transfer chamber 230, a plurality of processing chambers 240A to 240E and a controller 250.

(Loader Module 210)

The loader module 210 includes a plurality of door openers 211A to 211C, a transfer robot 212 and an alignment chamber 213. The door openers 211A to 211C open/close doors of containers C (for example, FOUP (Front Opening Unified Pod), SMIF (Standard Mechanical Inter Face) Pod or the like) of a wafer W to be processed. The transfer robot 212 transfers the wafer W among the container C, the alignment chamber 213 and the load lock chambers 220A and 220B.

Installed in the alignment chamber 213 is an aligner (not shown) for adjusting a notch (or orientation flat) position of the wafer W taken out of the container C and the eccentricity of the wafer W. In the following description, the adjustment of the notch (or orientation flat) position and the eccentricity of the wafer W are referred to as alignment. The wafer W unloaded by the transfer robot 212 from the container C is aligned in the alignment chamber 213 and is then transferred to the load lock chamber 220A (or 220B). The door openers 211A to 211C, the transfer robot 212 and the aligner in the alignment chamber 213 are controlled by the controller 250.

Each of the load lock chambers 220A and 220B is provided with a vacuum pump (for example, a dry pump) and a leak valve to switch between the air atmosphere and the vacuum atmosphere. The load lock chambers 220A and 220B include their respective gate valves GA and GB for loading/unloading the wafer W, which are installed at the side of the loader module 210. When the wafer W is loaded/unloaded into/out of the load lock chambers 220A and 220B by the transfer robot 212, the gate valves GA and GB are opened after the load lock chambers 220A and 220B are switched to the air atmosphere. The gate valves GA and GB are controlled by the controller 250.

(Transfer Chamber 230)

The transfer chamber 230 includes gate valves G1 to G7 and a transfer robot 231. The gate valves G1 and G2 are gate valves for the load lock chambers 220A and 220B, respectively. The gate valves G3 to G7 are gate valves for the processing chambers 240A to 240E, respectively. The transfer robot 231 transfers the wafer W between the load lock chambers 220A and 220B and the processing chambers 240A to 240E.

The transfer chamber 230 is also installed with a vacuum pump (for example, a dry pump) and a leak valve. The transfer chamber 230 is usually under a vacuum atmosphere and is switched to the air atmosphere if necessary (for example, when maintenance is required). In addition, a Turbo Molecular Pump (TMP) or a Cryo pump may be installed to implement a high vacuum environment. The gate valves G1 to G7 and the transfer robot 231 are controlled by the controller 250. In addition, the transfer chamber 230 may be turned to the non-oxidizing atmosphere by allowing the flow of an inert gas such as a nitrogen gas ($N_2$ gas), an argon gas (Ar gas), a helium gas (He gas) or the like into the transfer chamber 230. In addition, oxygen contained in the inert gas may be removed by an oxygen pump using yttria-stabilized zirconia (YSZ) to put the transfer chamber 230 under an extremely low-oxygen partial pressure condition.

(Processing Chamber 240A)

The processing chamber 240A is a degassing chamber. The processing chamber 210A heats the wafer W to a predetermined process temperature by means of a heater or a lamp in order to remove water and organic material adsorbed in the interlayer insulating layers 101 and 104 formed on the wafer W. The process temperature of the processing chamber 240A is preferably set to a temperature higher than a process temperature of the processing chamber 240C described later.

Since a Mn raw material gas (hereinafter referred to as a Mn precursor) used in the processing chamber 240C has high reactivity with water, the thickness of a Mn oxide (MnOx) to be formed may be varied depending on the amount of water, which may result in poor consistency in the film-forming process. To avoid this, the process temperature of the processing chamber 240A is preferably set to a temperature higher than the process temperature of the processing chamber 240C described later. In addition, the processing chamber 240A may be put under an inert gas atmosphere (non-oxidizing atmosphere) by allowing the flow of an inert gas such as a nitrogen gas ($N_2$ gas), an argon gas (Ar gas), a helium gas (He gas) or the like into the processing chamber 240A.

In some cases, in order to remove Cu oxide formed on a surface of the Cu wiring 102 exposed on the bottom of the via hole 104$h$, the processing chamber 240A may be put under a reducing gas atmosphere by allowing the flow of a reducing gas such as, for example, a hydrogen gas ($H_2$ gas), a carbon monoxide gas (CO gas), an ammonia gas ($NH_3$) gas, a carboxyl acid gas such as a formic acid gas, or the like into the processing chamber 240A. An example of process conditions for removal of the Cu oxide is as follows.

Process temperature (temperature of wafer W): 200 to 350 degrees C.
Process pressure: 1 (vacuum) to 2670 Pa
Process time: 30 to 300 seconds Through the above processing, water (physisorbed water) adsorbed on the interlayer insulating layers 101 and 104 can be removed to avoid an effect on the film forming process, thereby maintaining consistency in the film-forming process.

(Processing Chamber 240B)

The processing chamber 240B is a surface modifying chamber. In the processing chamber 240B, the surface of the interlayer insulating layer 104 is modified by generating plasma and exposing the interlayer insulating layer 104 to the generated plasma or exposing the interlayer insulating layer 104 to radical species derived from the plasma. This modification involves extraction (removal) of carbon (C) from the interlayer insulating layer 104, reinforcing compactness (densification), reduction of pore diameter, surface hydrophilization and so on. Different kinds of gases may be used to generate the plasma. For example, gases containing hydrogen (H), carbon (C), nitrogen (N) or oxygen (O) (one of a $H_2$ gas, CO gas, $CO_2$ gas, $CH_4$ gas, $N_2$ gas, $NH_3$ gas, $H_2O$ gas, $O_2$ gas, $O_3$ gas, NO gas, $N_2O$ gas and $NO_2$ gas, or a combination thereof) may be used to generate the plasma. In addition, it is to be understood that a noble gas such as He, Ar or the like may be added to facilitate ignition of the plasma.

In general, an organic material such as trimethylsilane or the like is used to form a Low-k layer (SiOC) constituting the interlayer insulating layer 104. For this reason, an alkyl group, including a methyl group (—$CH_3$), is contained in the interlayer insulating layer 104 and accordingly, a certain amount of carbon (C) is contained in the interlayer insulating layer 104. When the surface of the interlayer insulating layer 104 is exposed to plasma or ions and subjected to a modifying process, most of the carbon (C) escapes from the surface of the interlayer insulating layer 104. Accordingly, the surface composition of the interlayer insulating layer 104 is turned from SiOC to $SiO_2$.

As a result, a modified layer such as $SiO_2$ having increased compactness (densified) due to the leakage of C, is formed on the surface of the interlayer insulating layer 104. If the interlayer insulating layer 104 is a porous Low-k film, the modified layer formed on the surface of the interlayer insulating layer 104 by the modifying process has a state other than the porous state since the diameters of the pores are reduced and/or the pores are blocked, thereby allowing the modified layer to act as a pore seal of the interlayer insulating layer 104. As a result, when a Mn oxide layer is formed, it is possible to prevent a Mn precursor as a precursor of the Mn oxide layer from permeating into the interlayer insulating layer 104, thereby preventing an increase in the relative dielectric constant of the interlayer insulating layer 104.

In addition, by the above-described forming method, most of the surface of the interlayer insulating layer 104 comes to have a methyl group (—$CH_3$) and accordingly, the surface of the interlayer insulating layer 104 is a hydrophobic surface. When the above-described modifying process is performed, the methyl group is cleaved, resulting in a —OH group or a bond of Si—O—Si. That is, the above-described modifying process involves hydrophilization (i.e., the surface of the interlayer insulating layer 104 is modified by the modifying process from hydrophobicity to hydrophilicity). When the hydrophilic modified layer is formed on the surface of the interlayer insulating layer 104, a layer including mainly MnOx (Mn oxide) (hereinafter referred to as a Mn oxide layer) can be efficiently formed (deposited) on the interlayer insulating layer 104 in the processing chamber 240C described later.

In addition, the plasma process in the processing chamber 240B may be performed for a few seconds (e.g., one to 90 seconds). In addition, the process pressure and applied high-frequency power in the plasma process are not particularly limited. For example, from the standpoint of practical use, the process pressure may fall within a range of $10^{-1}$ to $10^5$ Pa and the high-frequency power may fall within a range of $10^1$ to $10^4$ Watt. In addition, when a gas containing hydrogen (H), or a gas containing oxygen (O) (one of a $H_2$ gas, CO gas, $CO_2$ gas, $CH_4$ gas, $NH_3$ gas, $H_2O$ gas, $O_2$ gas, $O_3$ gas, NO gas, $N_2O$ gas and $NO_2$ gas, or a combination thereof) is used for the plasma process, since formation of an —OH group in the surface of the interlayer insulating layer 104 is promoted, the Mn oxide layer can be more efficiently deposited.

In addition, in order to promote the effect of the plasma process, the surface of the interlayer insulating layer 104 may be subjected to the plasma process while heating the wafer W to a range of 100 to 350 degrees C. In this case, since the function of the processing chamber 240A is equipped in the processing chamber 240B, the processing chamber 240A and the processing chamber 240B may be integrated into a single processing chamber.

Means for generating the plasma may include a CCP (Capacitively Coupled Plasma) generating means, an ICP (Inductively Coupled Plasma) generating means, a HWP (Helicon Wave Plasma) generating means, a microwave-excited SWP (Surface Wave Plasma) generating means (including RLSA (Radial Line Slot Antenna) plasma and SPA (Slot Plane Antenna) plasma), an ECP (Electron Cyclotron resonance Plasma) generating means, and a remote plasma generating means using one or more of the above-mentioned plasma generating means.

In addition to the exposure of the surface of the interlayer insulating layer 104 to the plasma, other methods may be used to modify (mainly hydrophilize in this example) the surface of the interlayer insulating layer 104. For example, the surface of the interlayer insulating layer 104 may be irradiated with an ultraviolet ray while heating the wafer W to a range of 100 to 350 degrees C. under an oxygen atmosphere (for example, an atmosphere of an oxygen-containing gas containing an ozone ($O_3$) gas or an $O_2$ gas). A low pressure mercury lamp (wavelength: 185 to 254 nm) or a Xe excimer lamp (wavelength: 172 nm) may be used for the irradiation of the ultraviolet ray. A short-wavelength ultraviolet ray (wavelength: 240 nm or less) is preferably used.

In addition, the surface of the interlayer insulating layer 104 may be irradiated with a gas cluster ion beam (GCIB). Examples of a gas may include $O_2$, $N_2$, $H_2$, $CH_4$, Ar, He and the like. In addition, the surface of the interlayer insulating layer 104 may be irradiated with visible light having a wavelength of 425 nm. The visible light having the wavelength of 425 nm (violet) corresponds to bonding energy of silicon (Si) and methyl group (Si—$CH_3$) and can efficiently cleave the methyl group.

In addition, the surface of the interlayer insulating layer 104 may be modified by chemical treatment in which the surface is exposed to a process solution containing an oxidizing agent such as hydrogen peroxide ($H_2O_2$). Due to a strong oxidizing power of hydrogen peroxide, most of the carbon (C) escapes from the surface of the interlayer insulating layer 104. The surface composition of the interlayer insulating layer 104 approaches from SiOC to $SiO_2$, i.e., becomes closer to hydrophilization.

(Processing Chamber 240C)

The processing chamber 240C is used to form a Mn oxide layer on the surface of the interlayer insulating layer 104. Examples of the processing chamber 240C may include an ALD (Atomic Layer Deposition) chamber and a CVD (Chemical Vapor Deposition) chamber. FIG. 3 is a sectional view of the processing chamber 240C.

As shown in FIG. 3, the processing chamber 240C includes a vacuum-exhaustible processing container 241, a susceptor 242 and a shower head 243 installed in the processing container 241. A loading/unloading port 241a for the wafer W is formed in a side wall of the processing container 241 and is connected to the transfer chamber 230 via the gate valve G5.

The susceptor 242 is erected from the bottom of the processing container 241 and has a resistive heater 242a embedded therein for heating the wafer W mounted on the susceptor 242 to a predetermined temperature. The processing chamber 240C is equipped with a Mn precursor supply system (not shown) and a reactive gas supply system (not shown) which communicates with the shower head described later. The shower head 243 is attached to the ceiling of the processing container 241 and introduces Mn precursors, a carrier gas (for example, a $H_2$ gas or a $N_2$ gas) and a reactive gas such as $H_2O$ or the like.

A gas diffusion space S is formed in the shower head 243 and the Mn precursors and the carrier gas introduced into the gas diffusion space S are ejected through a plurality of ejection holes 243h formed in the shower head 243 into the processing container 241. A reactive gas such as $H_2O$ is introduced into the gas diffusion space S at a timing different from the Mn precursors and is ejected through the plurality of ejection holes 243h formed in the shower head 243 into the processing container 241.

An example of the Mn precursors may include a variety of organic metal materials containing manganese (Mn). (EtCp)$_2$Mn[=Mn($C_2H_5C_5H_4$)$_2$] is preferably used as the Mn precursors since it is liquid at room temperature and has enough vapor pressure for a bubbling supply and high thermal stability.

An example of organic metal materials containing manganese (Mn) which can be used in this embodiment is as follows.

Cp$_2$Mn[=Mn($C_5H_5$)$_2$],
(MeCp)$_2$Mn[=Mn($CH_3C_5H_4$)$_2$],
(Me$_5$Cp)$_2$Mn[=Mn(($CH_3)_5C_5H_4$)$_2$],
(EtCp)$_2$Mn[=Mn($C_2H_5C_5H_4$)$_2$],
(i-PrCp)$_2$Mn[=Mn($C_3H_7C_5H_4$)$_2$],
(t-BuCp)$_2$Mn[=Mn($C_4H_9C_5H_4$)$_2$],
MeCpMn(CO)$_3$[=($CH_3C_5H_4$)Mn(CO)$_3$],
CpMn(CO)$_3$[=($C_5H_5$)Mn(CO)$_3$],
MeMn(CO)$_5$[=($CH_3$)Mn(CO)$_5$],
Mn$_2$(CO)$_{10}$,
3-(t-BuAllyl)Mn(CO)$_4$,
Mn(DPM)$_2$[=Mn($C_{11}H_{19}O_2$)$_2$],
Mn(DPM)$_3$[=Mn($C_{11}H_{19}O_2$)$_3$],
Mn(DMPD)(EtCp)[=Mn($C_{71}H_{11}C_2H_5C_5H_4$)],
Mn(acac)$_2$[=Mn($C_5H_7O_2$)$_2$],
Mn(acac)$_3$[=Mn($C_5H_7O_2$)$_3$],
Mn(hfac)$_2$[=Mn($C_5HF_6O_2$)$_2$],
Mn(hfac)$_3$[=Mn($C_5HF_6O_2$)$_3$],
Mn(iPr-AMD)$_2$[=Mn($C_3H_7$NC($CH_3$)N$C_3H_7$)$_2$], and
Mn(tBu-AMD)$_2$[=Mn($C_4H_9$NC($CH_3$)N$C_4H_9$)$_2$]

In addition, amideaminoalkane manganese compounds such as bis (N,N'-1-alkylamide-2-dialkylaminoalkane) manganese expressed by the chemical formula $Mn(R^1N-Z-NR^2{}_2)_2$ disclosed in WO2012/060428 may be appropriately used. Where, $R^1$ and $R^2$ are alkyl groups represented by $-C_nH_{2n+1}$ (n is an integer of 0 or higher) and Z is an alkylene group represented by $-C_nH_{2n}-$ (n is an integer of 0 or more).

On the other hand, an example of the reactive gas may include an oxygen-containing gas such as, for example, $H_2O$, $N_2O$, $NO_2$, $NO$, $O_2$, $O_3$, $H_2O_2$, $CO$, $CO_2$, alcohols, aldehydes, carboxylic acids, carboxylic anhydrides, esters, organic acid ammonium salts, organic acid amine salts, organic acid amides, organic acid hydrazides, or a combination thereof. It is here noted that a liquid at room temperature is supplied into the processing chamber 240C after it is changed into a gas or vapor.

The Mn precursors introduced into the shower head 243 are ejected through the ejection holes 243h into the processing container 241 and arrive at the surface of the wafer W. Some of the Mn precursors are adsorbed on the surface of the wafer W. When a precursor adsorption layer is formed after introducing the Mn precursors for a certain period of time, the processing container 241 is evacuated for a certain period of time. At this time, in order to increase the purging effect to a residual gas, an inert gas such as nitrogen ($N_2$) or the like may be introduced into the shower head 243 and the processing container 241. Next, a reactive gas such as $H_2O$ or the like is introduced thereinto. A reactive gas such as $H_2O$ or the like introduced into the shower head 243 is ejected through the ejection holes 243h into the processing container 241 and arrives at the surface of the wafer W. The reactive gas reacts with the Mn precursors (the precursor adsorption layer) already adsorbed on the surface of the wafer W, thereby forming a Mn oxide layer on the surface of the interlayer insulating layer 104 of the semiconductor device 100 formed on the wafer W.

Similarly, after introducing the reactive gas for a certain period of time, the processing container 241 is evacuated for a certain period of time. At this time, in order to increase the purging effect to a residual gas, an inert gas such as nitrogen ($N_2$) or the like may be introduced into the shower head 243 and the processing container 241. Thereafter, Mn precursors are introduced thereinto. In this way, for an ALD apparatus, the Mn oxide layer is formed while alternately supplying the reactive gas, such as water ($H_2O$) or the like, and the Mn precursors. Here, the composition of Mn oxide, which is formed by an ALD method while bubbling $(EtCp)_2Mn$ with a $N_2$ gas and alternately supplying it and $H_2O$, is $Mn_2O_3$ In addition, if the processing chamber 240C is a CVD apparatus, in order to promote formation of a Mn oxide layer, it is preferable that an oxygen (O)-containing gas be introduced into the processing chamber 240C. Like the ALD method, an example of the oxygen-containing gas may include $H_2O$, $N_2O$, $NO_2$, $NO$, $O_2$, $O_3$, $H_2O_2$, $CO$, $CO_2$, alcohols, aldehydes, carboxylic acids, carboxylic anhydrides, esters, organic acid ammonium salts, organic acid amine salts, organic acid amides, organic acid hydrazides, or a combination thereof. It is also noted that a liquid at room temperature is supplied into the processing chamber 240C after it is changed into a gas or vapor.

In addition, when the Mn oxide is formed by CVD, since the Mn precursors and the reactive gas (for example, an oxygen-containing gas) are simultaneously introduced into the processing chamber, a flow rate of the introduced reactive gas is preferably set to be extremely low, for example, to 1 sccm or less for the control of film thickness. In addition, for the control of the flow rate, the reactive gas to be introduced into the processing chamber may be diluted with an inert gas to about 1/100 in concentration.

In addition, for the prevention of particles and the prevention of blocking of ejection holes of the shower head, it is desirable that the mixing of the Mn precursors and the reactive gas is carried out after the gases are introduced into the processing chambers, i.e., in a post-mix method. FIG. 3 shows an example of a so-called pre-mix method in which Mn precursors and a reaction gas are mixed in the shower head before these gases are introduced in the processing chambers.
(Processing Chamber 240D)

The processing chamber 240D is an annealing chamber. In the processing chamber 240D, the Mn oxide layer formed on the interlayer insulating layer 104 in the processing chamber 240C is annealed under a reducing atmosphere to form a Mn silicate layer, thereby causing the Mn oxide layer to react with the silicon oxide (SiOx) of the interlayer insulating layer 104. Here, it is sufficient if the reducing atmosphere contains reducing gas ingredients such as hydrogen (H), carbon monoxide (CO), ammonia ($NH_3$), hydrazine ($N_2H_4$) or the like without needing 100% of reducing gas concentration. In addition, in the case of hydrogen, a cylinder of an Ar gas containing 3% of $H_2$ may be used in consideration of the lower limit of hydrogen explosion. In addition, as process conditions of the processing chamber 240D, for example, the process temperature (the temperature of the wafer W) is 150 degrees C. to 600 degrees C. and the process pressure is 1 to 2670 Pa.

The process temperature (the temperature of the wafer W) is preferably 300 degrees C. or higher from the standpoint of reaction speed (if less than 300 degrees C., it takes too much time to cause a reaction) and is preferably 450 degrees C. or lower from the standpoint of practical use (in order to avoid the possibility of causing damage and having deteriorated performance by exposure of the semiconductor device to the high temperature). In addition, if the semiconductor device is processed in a batch furnace or the like, a process pressure of about 1 atm is also possible.

Next, a mechanism in which the Mn oxide layer turns to silicate through a reaction with the $SiO_2$ ingredient contained in an underlying layer to form the Mn silicate layer by annealing the Mn oxide layer under the reducing atmosphere will be described with reference to chemical reaction formulas.

Chemical reaction formulas of manganese oxide (MnO and $Mn_2O_3$ in this example) and silicon dioxide ($SiO_2$) will be described below. Each chemical reaction formula shows the equilibrium state at 300K. In each chemical reaction formula, the amount of heat in the right side is the amount of heat per 1 mol of manganese (Mn), wherein the change amount in Gibb's free energy (hereinafter referred to as Gr change ($\Delta Gr$)) is expressed in 2 significant digits. Here, the Gibb's free energy tends to decrease spontaneously. Therefore, it is known that a chemical reaction having a minus Gr variation occurs spontaneously and a chemical reaction having a plus Gr variation does not occur spontaneously. An available thermodynamics database is used for the following thermodynamics calculation.

$$MnO+SiO_2 \rightarrow MnSiO_3 - 21 (\Delta Gr(kJ/Mn\text{-}mol)) \quad (1)$$

$$2Mn_2O_3+4SiO_2 \rightarrow 4MnSiO_3+O_2+57(\Delta Gr(kJ/Mn\text{-}mol)) \quad (2)$$

$$2Mn_2O_3+2SiO_2 \rightarrow 2Mn_2SiO_4+O_2+53(\Delta Gr(kJ/Mn\text{-}mol)) \quad (3)$$

From the chemical reaction formula (1), it can be seen that, for MnO, a reaction can progress from the left side to the right side, i.e., there is a possibility that MnO is turned to silicate. On the other hand, from the chemical reaction formulas (2)

and (3), it can be seen that a reaction cannot progress spontaneously from the left side to the right side, i.e., there is no possibility of turning into silicate. Thus, it can be seen that $Mn_2O_3$ remains since it cannot be turned into silicate only by annealing.

Next, when hydrogen (H) is introduced, a chemical reaction formula of $Mn_2O_3$ and $SiO_2$ is shown below.

$$Mn_2O_3+2SiO_2+H_2 \rightarrow 2MnSiO_3+H_2O-58(\Delta Gr(kJ/Mn\text{-}mol)) \quad (4)$$

$$Mn_2O_3+SiO_2+H_2 \rightarrow Mn_2SiO_4+H_2O-62(\Delta Gr(kJ/Mn\text{-}mol)) \quad (5)$$

From the chemical reaction formulas (4) and (5), it can be seen that, when hydrogen (H) is introduced, for $Mn_2O_3$, a reaction can progress from the left side to the right side, i.e., there is a possibility that $Mn_2O_3$ is turned into silicate. Thus, it can be seen that $Mn_2O_3$ can be turned into silicate by the introduction of hydrogen to form MnSixOy.

Next, when carbon monoxide (CO) is introduced, a chemical reaction formula of $Mn_2O_3$ and $SiO_2$ is shown below.

$$Mn_2O_3+2SiO_2+CO \rightarrow 2MnSiO_3+CO_2-72(\Delta Gr(kJ/Mn\text{-}mol)) \quad (6)$$

$$Mn_2O_3+SiO_2+CO \rightarrow Mn_2SiO_4+CO_2-76(\Delta Gr(kJ/Mn\text{-}mol)) \quad (7)$$

From the chemical reaction formulas (6) and (7), it can be seen that, when carbon monoxide (CO) is introduced, for $Mn_2O_3$, a reaction can progress from the left side to the right side, i.e., there is a possibility that $Mn_2O_3$ is turned into silicate. Thus, it can be seen that $Mn_2O_3$ can become silicate by the introduction of carbon monoxide to form MnSixOy.

Next, when ammonia ($NH_3$) is introduced, a chemical reaction formula of $Mn_2O_3$ and $SiO_2$ is shown below.

$$Mn_2O_3+2SiO_2+0.5NH_3 \rightarrow 2MnSiO_3+0.25N_2O+0.75H_2O-12(\Delta Gr(kJ/Mn\text{-}mol)) \quad (8)$$

$$Mn_2O_3+SiO_2+0.5NH_3 \rightarrow Mn_2SiO_4+0.25N_2O+0.75H_2O-16(\Delta Gr(kJ/Mn\text{-}mol)) \quad (9)$$

From the chemical reaction formulas (8) and (9), it can be seen that, when ammonia ($NH_3$) is introduced, for $Mn_2O_3$, a reaction can progress from the left side to the right side, i.e., there is a possibility of turning into silicate. Thus, it can be seen that $Mn_2O_3$ can become silicate by the introduction of ammonia to form MnSixOy.

Next, when hydrazine ($N_2H_4$) is introduced, a chemical reaction formula of $Mn_2O_3$ and $SiO_2$ is shown below.

$$Mn_2O_3+2SiO_2+0.33N_2H_4 \rightarrow 2MnSiO_3+0.33N_2O+0.67H_2O-29(\Delta Gr(kJ/Mn\text{-}mol)) \quad (10)$$

$$Mn_2O_3+SiO_2+0.33N_2H_4 \rightarrow Mn_2SiO_4+0.33N_2O+0.67H_2O-33(\Delta Gr(kJ/Mn\text{-}mol)) \quad (11)$$

From the chemical reaction formulas (10) and (11), it can be seen that, when hydrazine ($N_2H_4$) is introduced, for $Mn_2O_3$, a reaction can progress from the left side to the right side, i.e., there is a possibility of turning into silicate. Thus, it can be seen that $Mn_2O_3$ can become silicate by the introduction of hydrazine to form MnSixOy.

Next, a chemical reaction formula of $Mn_2O_3$ is shown below.

$$2Mn_2O_3 \rightarrow 4MnO+O_2+78(\Delta Gr(kJ/Mn\text{-}mol)) \quad (12)$$

$$Mn_2O_3+H_2 \rightarrow 2MnO+H_2O-37(\Delta Gr(kJ/Mn\text{-}mol)) \quad (13)$$

$$Mn_2O_3+CO \rightarrow 2MnO+CO_2-51(\Delta Gr(kJ/Mn\text{-}mol)) \quad (14)$$

$$Mn_2O_3+0.5NH_3 \rightarrow 2MnO+0.25N_2O+0.75H_2O+9.0(\Delta Gr(kJ/Mn\text{-}mol)) \quad (15)$$

Where, $\Delta Gr$ is minus for 500K or higher.

From the chemical reaction formula (12), it can be seen that $Mn_2O_3$ cannot become MnO when it is simply annealed without introducing a reducing gas such as hydrogen, carbon monoxide or the like. In addition, as shown in the chemical reaction formulas (2) and (3), since $Mn_2O_3$ cannot become silicate only by annealing with no reducing gas, if a reducing gas such as hydrogen, carbon monoxide or the like is not introduced, it can be seen that $Mn_2O_3$ cannot become silicate to form Mn silicate (MnSixOy).

On the other hand, from the chemical reaction formulas (13) to (15), it can be seen that $Mn_2O_3$ can become MnO when hydrogen, carbon monoxide or ammonia is introduced. In addition, as shown in the chemical reaction formula (1), since MnO can become silicate to form Mn silicate (MnSixOy), it can be seen that $Mn_2O_3$ can become silicate to form Mn silicate (MnSixOy) when a reducing gas such as hydrogen, carbon monoxide, ammonia or the like is introduced.

For reference, when oxygen (O) is introduced, a chemical reaction of $Mn_2O_3$ and $SiO_2$ is considered.

$$2Mn_2O_3+4SiO_2+O_2 \rightarrow 4MnSiO_3+2O_2 \quad (16)$$

$$2Mn_2O_3+2SiO_2+O_2 \rightarrow 2Mn_2SiO_4+2O_2 \quad (17)$$

The chemical reaction formula (16) becomes equal to the chemical reaction formula (2) when oxygen (O) on the left side is cancelled with oxygen (O) on the right side and the chemical reaction formula (17) becomes equal to the chemical reaction formula (3) when oxygen (O) on the left side is cancelled with oxygen (O) on the right side. Thus, it can be seen that a reaction cannot progress from the left side to the right side, i.e., $Mn_2O_3$ cannot become silicate, even when oxygen (O) is introduced. In this way, as disclosed in many prior arts, it can be understood that introduction of oxygen (O) cannot make $Mn_2O_3$ silicate but only annealing with introduction of hydrogen (H) makes it possible to make silicate. In addition, although this discussion is made by way of an example of MnO and $Mn_2O_3$, this discussion can be equally applied to $Mn_3O_4$ and $MnO_2$ which require introduction of a reducing gas such as hydrogen, carbon monoxide or the like for the purpose of making them ($Mn_3O_4$ and $MnO_2$) silicate.

The reducing gas used is not limited to the above-mentioned ones but may be a substance similar to ammonia or hydrazine. For example, an ammonia-similar substance may be amine expressed by the chemical formula $NR^1R^2R^3$. Where, $R^1$, $R^2$ and $R^3$ are hydrocarbon groups such as, for example, methylamine ($CH_3NH_2$), ethylamine ($C_2H_5NH_2$), dimethylamine (($CH_3)_2NH$), trimethylamine (($CH_3)_3N$) and the like.

A hydrazine-similar substance may be hydrazine derivatives expressed by the chemical formula $R^1R^2NNR^3R^4$. Where, $R^1$, $R^2$, $R^3$ and $R^4$ are hydrocarbon groups such as, for example, methylhydrazine ($CH_3NNH_3$), dimethylhydrazine (($CH_3)_2NNH_2$), trimethylhydrazine (($CH_3)_3NNH$) and the like.

(Processing Chamber 240E)

The processing chamber 240E is a deposition chamber such as a PVD (Physical Vapor Deposition) chamber, a CVD chamber or the like. In the processing chamber 240E, a Cu film as a seed layer is formed on the Mn silicate layer 105 formed in the processing chamber 240D.

The controller 250 is, for example, a computer and controls the loader module 210, the load lock chambers 220A and 220B, the transfer chamber 230, the processing chambers 240A to 240E and the gate valves GA, GB and G1 to G7 of the semiconductor manufacturing apparatus 200.

(Manufacture of Semiconductor Device 100)

FIGS. 4A to 4E are views illustrating manufacturing processes of the semiconductor device 100. FIGS. 5A to 5C are flow charts illustrating a process flow of the semiconductor manufacturing apparatus 200. Here, a method for manufacturing the semiconductor device 100 described with reference to FIG. 1 using the semiconductor manufacturing apparatus 200 described with reference to FIG. 2 will be described. A method of manufacturing the semiconductor device 100 using the semiconductor manufacturing apparatus 200 will now be described with reference to FIGS. 1 to 5C. Here, a process until a seed layer (Cu film) is formed on the Mn silicate layer 105 of the semiconductor device 100 will be described.

In the following description, it is assumed that the semiconductor device 100 has been formed on the wafer W before being transferred to the semiconductor manufacturing apparatus 200 up to the state shown in FIG. 4A. In other words, the process described below involves forming the Mn silicate layer 105 on the surface of the interlayer insulating layer 104 including the via hole 104h and the trench (wiring groove) 104t.

The container C is transferred to the semiconductor manufacturing apparatus 200 and is mounted on one of the door openers 211A to 211C and a cover of the container C is opened by the door opener 211A to 211C. The wafer W on which the semiconductor device 100 has been formed up to the state of FIG. 4A is accommodated in the container C. Next, the wafer W is taken out of the container C by the transfer robot 212 and is transferred to the alignment chamber 213. Alignment of the wafer W is performed in the alignment chamber 213.

The transfer robot 212 takes the aligned wafer W out of the alignment chamber 213 and transfers it to the load lock chamber 220A (or 220B). When the wafer W is transferred to the load lock chamber 220A (or 220B), the load lock chamber 220A (or 220B) is put under the air atmosphere.

After the wafer W is loaded, the gate valve GA (or GB) of the load lock chamber 220A (or 220B) is closed. Thereafter, the load lock chamber 220A (or 220B) is exhausted to create a vacuum atmosphere.

After the load lock chamber 220A (or 220B) is exhausted to create a vacuum atmosphere, the gate valve G1 (or GB) is opened. The wafer W is loaded by the transfer robot 231 into the transfer chamber 230 put under a non-oxidizing atmosphere, such as, for example, a vacuum state, an extremely low-oxygen partial pressure state or a $H_2$ gas or CO gas reducing atmosphere. After the wafer W is loaded into the transfer chamber 230, the gate valve G1 (or G2) is closed.

Figure 4A:
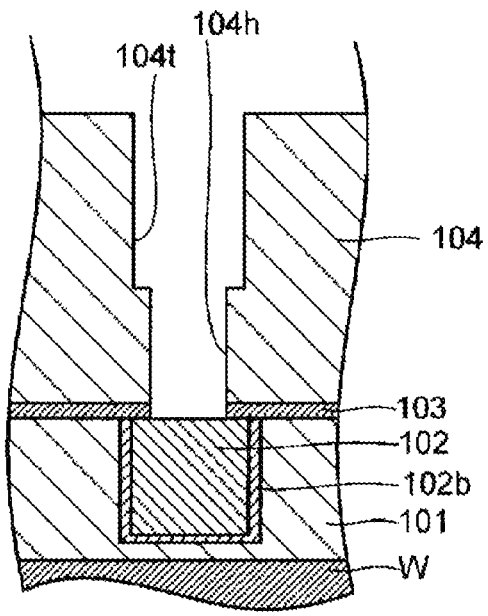
FIG. 4A is a view illustrating a semiconductor device manufacturing process according to an embodiment.
Figure 5A:
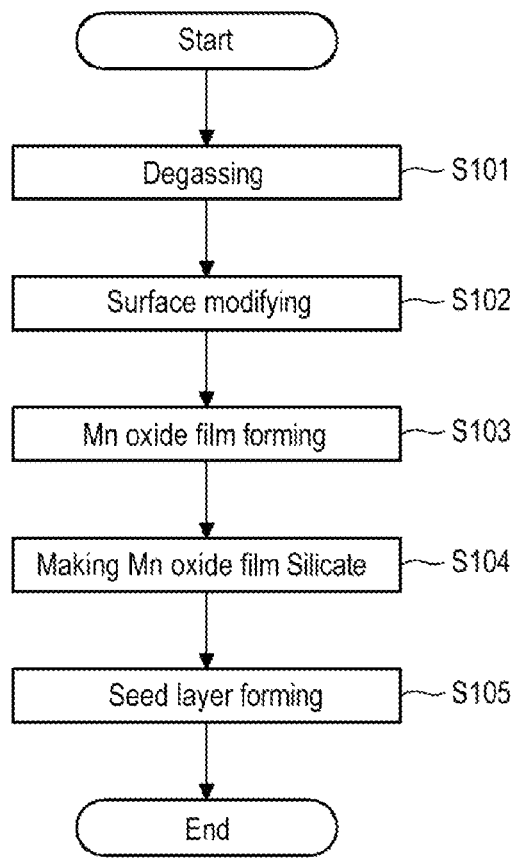
FIG. 5A is a flow chart illustrating a process flow of a semiconductor manufacturing apparatus.

(Degassing Process: see FIG. 4A)

Next, the gate valve G3 is opened and the transfer robot 231 transfers the wafer W into the processing chamber 240A. After the gate valve G3 is closed, the wafer W is degased in the processing chamber 240A (Step S101 in FIG. 5A). Specifically, in the processing chamber 240A, the wafer W is heated by means of a heater or a lamp in order to remove water and organic matter adsorbed on the wafer W.

A temperature for the degassing process is preferably set to a temperature higher than the process temperature of the processing chamber 240C in order to prevent poor reproducibility of the film-forming process of Mn oxide in the processing chamber 240C. In addition, the processing chamber 240A may be turned to an inert gas atmosphere (non-oxidizing atmosphere) by allowing the flow of an inert gas such as a nitrogen gas ($N_2$ gas), an argon gas (Ar gas), a helium gas (He gas) or the like into the processing chamber 240A.

Figure 4B:
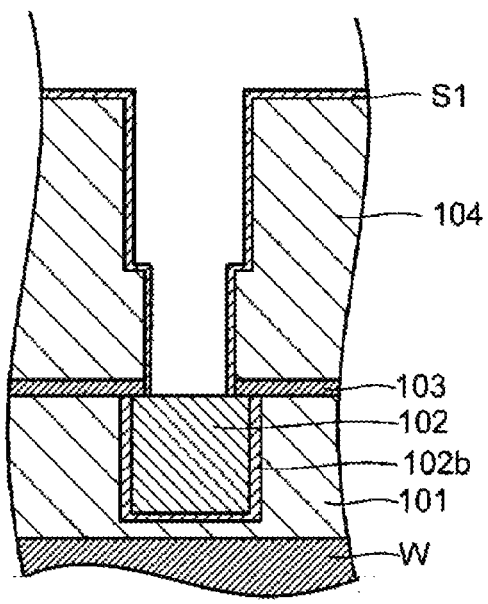
FIG. 4B is a view illustrating a semiconductor device manufacturing process according to an embodiment.

(Surface Modifying Process: see FIG. 4B)

Next, the gate valve G3 is opened and the transfer robot 231 loads the wafer W into the transfer chamber 230. After the gate valve G3 is closed, the gate valve G4 is opened and the transfer robot 231 transfers the wafer W into the processing chamber 240B. In the processing chamber 240B, the interlayer insulating layer 104 is subjected to a surface modifying treatment (extraction (removal) of carbon (C), increasing compactness (densification), reduction of pore diameter, surface hydrophilization and so on) (Step S102 in FIG. 5A). Specifically, in the processing chamber 240B, a modified layer 51 is formed on the surface of the interlayer insulating layer 104 by generating plasma and exposing the interlayer insulating layer 104 to the plasma.

Different kinds of gases such as, for example, gases containing hydrogen (H), carbon (C), nitrogen (N) or oxygen (O) (one of a $H_2$ gas, CO gas, $CO_2$ gas, $CH_4$ gas, $N_2$ gas, $NH_3$ gas, $H_2O$ gas, $O_2$ gas, $O_3$ gas, NO gas, $N_2O$ gas and $NO_2$ gas, or a combination thereof) may be used to generate the plasma. In addition, a noble gas such as He, Ar or the like may be added to facilitate ignition of the plasma.

In addition, an organic material such as trimethylsilane or the like is, in general, used to form a Low-k layer (SiOC) constituting the interlayer insulating layer 104. For this reason, an alkyl group, including a methyl group (—$CH_3$), is contained in the interlayer insulating layer 104 and accordingly, a certain amount of carbon (C) is contained in the interlayer insulating layer 104. When the surface of the interlayer insulating layer 104 is exposed to plasma or ions for modifying treatment, most of the carbon (C) escapes from the surface of the interlayer insulating layer 104. Accordingly, the surface composition of the interlayer insulating layer 104 approaches from SiOC to $SiO_2$.

As a result, a modified layer S1, such as compact (densified) $SiO_2$, from which C escapes, is formed on the interlayer insulating layer 104. In addition, if the interlayer insulating layer 104 is a porous Low-k film, the modified layer S1 formed on the surface of the interlayer insulating layer 104 by the modifying treatment has a state other than the porous state since pores are reduced in diameter and/or blocked, thereby allowing the modified layer S1 to act as a pore seal of the interlayer insulating layer 104. As a result, when a Mn oxide layer is formed, it is possible to prevent a Mn precursor as a precursor of the Mn oxide layer from permeating into the interlayer insulating layer 104, thereby preventing increase of a relative dielectric constant of the interlayer insulating layer 104.

In addition, when the above-described modifying treatment is performed, a methyl group existing on the surface of the interlayer insulating layer 104 is cleaved, resulting in a —OH group or a bond of Si—O—Si, i.e., the surface of the interlayer insulating layer 104 is modified from hydrophobicity to hydrophilicity. When the hydrophilic modified layer S1 is formed on the surface of the interlayer insulating layer 104, a Mn oxide layer can be efficiently formed (deposited) on the interlayer insulating layer 104 in the next processing chamber 240C.

Figure 4C:
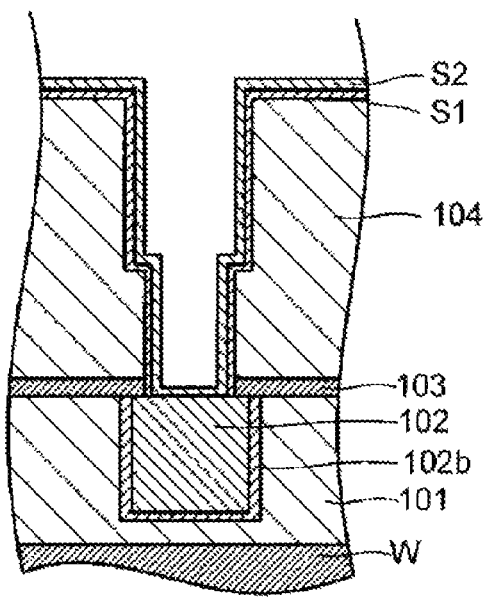
FIG. 4C is a view illustrating a semiconductor device manufacturing process according to an embodiment.
Figure 4D:
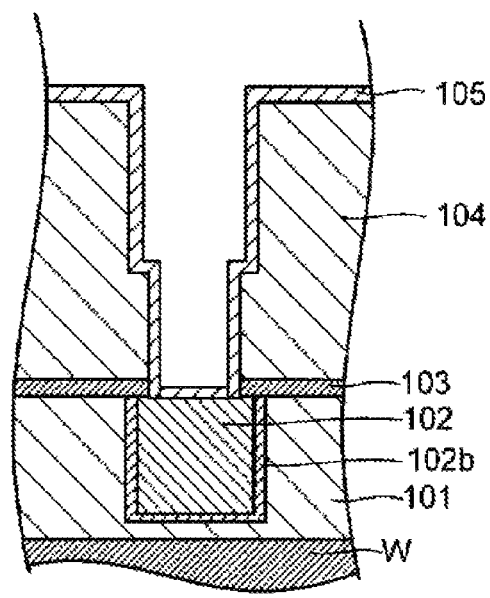
FIG. 4D is a view illustrating a semiconductor device manufacturing process according to an embodiment.

(Mn Oxide Forming Process: see FIG. 4C)

Next, the gate valve G4 is opened and the transfer robot 231 loads the wafer W into the transfer chamber 230. After the gate valve G4 is closed, the gate valve G5 is opened and the transfer robot 231 transfers the wafer W into the processing chamber 240C. In the processing chamber 240C, a process of forming a Mn oxide layer S2 is performed (Step S103 in FIG. 5A).

Specifically, Mn precursors (for example, $(EtCp)_2Mn[=Mn(C_2H_5C_5R)_2]$), a carrier gas (for example, a $H_2$ gas or a $N_2$ gas) and a reactive gas such as $H_2O$ or the like are introduced into the processing chamber 240C to form the Mn oxide layer S2 on the surface of the modified layer S1 of the interlayer insulating layer 104.

When the Mn oxide layer S2 is formed by an ALD method, the Mn precursors are introduced through the shower head 243 and some of the Mn precursors are adsorbed on the surface of the interlayer insulating layer (the modified layer S1). After introducing the Mn precursors for a certain time, the processing container 241 is evacuated for a certain time. Next, a reactive gas such as $H_2O$ or the like is introduced through the shower head 243 to react with the Mn precursors already adsorbed on the surface, thereby forming the Mn oxide layer S2 on the surface of the interlayer insulating layer 104 (the modified layer S1). Similarly, the Mn oxide layer S2 is formed by alternately supplying the reactive gas such as water (H2O) and the Mn precursors.

In addition, if the Mn oxide layer S2 is formed by a CVD apparatus, in order to promote formation of the Mn oxide layer S2, an oxygen (O)-containing gas may be introduced into the processing chamber 240C. Like the ALD method, an example of the oxygen-containing gas may include $H_2O$, $N_2O$, $NO_2$, $NO$, $O_2$, $O_3$, $H_2O_2$, $CO$, $CO_2$, alcohols, aldehydes, carboxylic acids, carboxylic anhydrides, esters, organic acid ammonium salts, organic acid amine salts, organic acid amides, organic acid hydrazides, or a combination thereof.

In addition, when the Mn oxide is formed by CVD, since the Mn precursors and the reactive gas (for example, an oxygen-containing gas) are simultaneously introduced into the processing chamber 240C, a flow rate of the introduced reactive gas may be set to be extremely low, for example, to 1 sccm or less from the standpoint of film thickness control. In addition, from the standpoint of flow rate control, the reactive gas to be introduced into the processing chamber may be diluted with an inert gas to about 1/100 in concentration. In addition, from the standpoint of prevention of particles and prevention of blocking of ejection holes of the shower head, it is desirable that the mixing of the Mn precursors and the reactive gas is carried out by a so-called post-mix method which is performed after the gases are introduced into the processing chambers.

(Process for Changing into Silicate: See FIG. 4D)

Next, the gate valve G5 is opened and the transfer robot 231 loads the wafer W into the transfer chamber 230. After the gate valve G5 is closed, the gate valve G6 is opened and the transfer robot 231 transfers the wafer W into the processing chamber 240D. In the processing chamber 240D, a process for changing into silicate is performed (Step S104 in FIG. 5A). Specifically, in the processing chamber 240D, the Mn oxide layer S2 formed on the interlayer insulating layer 104 (the modified layer S1) is annealed under a reducing atmosphere to form the Mn silicate layer 105 by causing the annealed Mn oxide layer S2 to react with the silicon oxide (SiOx) of the interlayer insulating layer 104 (particularly the modified layer S1 formed on the surface).

Here, it is sufficient if the reducing atmosphere contains reducing gas ingredients such as hydrogen (H), carbon monoxide (CO), ammonia ($NH_3$), hydrazine ($N_2H_4$) or the like without needing 100% of reducing gas concentration. In addition, in the case of hydrogen, a cylinder of an Ar gas containing 3% of $H_2$ may be used in consideration of the lower limit of hydrogen explosion. In addition, as process conditions of the processing chamber 240D, for example, the process temperature (the temperature of the wafer W) is 150 degrees C. to 600 degrees C. and the process pressure is 1 to 2670 Pa.

The process temperature (the temperature of the wafer W) is preferably 300 degrees C. or higher from the standpoint of reaction speed (if less than 300 degrees C., it takes too much time to cause a reaction) and is preferably 450 degrees C. or lower from the standpoint of practical use (in order to avoid a possibility of damage and deteriorated performance caused by exposure of the semiconductor device to a high temperature). In addition, if the semiconductor device is processed in a batch furnace or the like, the annealing process may be performed under a process pressure of about 1 atm.

Figure 4E:
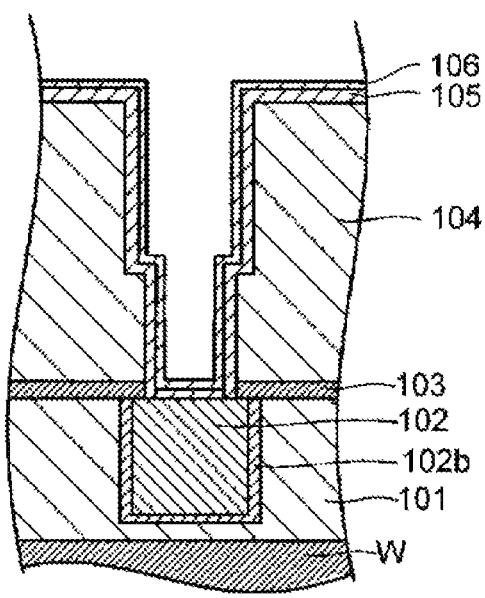
FIG. 4E is a view illustrating a semiconductor device manufacturing process according to an embodiment.

(Seed Layer Forming Process: see FIG. 4E)

Next, the gate valve G6 is opened and the transfer robot 231 loads the wafer W into the transfer chamber 230. After the gate valve G6 is closed, the gate valve G7 is opened and the transfer robot 231 transfers the wafer W into the processing chamber 240E. In the processing chamber 240E, a Cu film 106 as a seed layer is formed on the Mn silicate layer 105 (Step S105 in FIG. 5A).

Next, the gate valve G7 is opened and the transfer robot 231 loads the wafer W into the transfer chamber 230. After the gate valve G7 is closed, the gate valve G1 (or G2) is opened and the transfer robot 231 transfers the wafer W into the load lock chamber 220A (or 220B).

After the gate valve G1 (or G2) is closed, the load lock chamber 220A (or 220B) is ventilated with CDA (Clean Dry Air) or $N_2$. Accordingly, the load lock chamber 220A (or 220B) is changed from the vacuum atmosphere to the air atmosphere. Next, the gate valve GA (or GB) is opened and the transfer robot 212 accommodates the wafer W into the container C.

When processing for all (or designated) wafers W in the container C is completed, the container C is transferred to a plating apparatus (not shown) by means of a transfer means (not shown) such as RGV (Rail Guided Vehicle), OHV (Overhead Hoist Vehicle), AGV (Automatic Guided Vehicle) or the like. In the plating apparatus, with Cu deposited on the Mn silicate layer 105 as a seed layer, Cu plating is performed to form a Cu layer on the Mn silicate layer 105. Thereafter, in a CMP apparatus, the Mn silicate layer 105 and the Cu layer formed on the interlayer insulating layer 104 is removed by polishing and a Cu via and a Cu wiring embedded in the via hole 104h and the trench 104t are formed. In addition, the wafer W polished by a CMP method is cleaned to remove residue such as slurry and the like.

As described above, in the processing chamber 240D of the semiconductor manufacturing apparatus 200 according to this embodiment, since the annealing process is performed under the reducing atmosphere, the Mn oxide layer S2 can be efficiently turned into silicate to form the Mn silicate layer 105. In addition, since the Mn silicate layer 105 is more amorphous and smaller in crystal grain boundary than the Mn oxide layer S2, the barrier property can be improved. In addition, when the Mn oxide layer S2 becomes silicate by reaction with the silicon oxide (SiOx) of the interlayer insulating layer 104 (particularly, the modified layer S1), a volume (film thickness) thereof is reduced. Accordingly, since a sectional area of a Cu wiring or a via conductor formed on the surface of the Mn silicate layer 105 increases as much, the Cu wiring or the via conductor can have low resistance. Since the Mn oxide layer S2 may take a plurality of states, e.g., MnO, $Mn_3O_4$, $Mn_2O_3$, $MnO_2$ or the like, this layer is unstable because of its change in density and volume. However, in this embodiment, since the Mn oxide layer S2 is turned to silicate to form a more stable Mn silicate layer 105, aging degradation of the semiconductor device 100 can be reduced.

In addition, after the hydrophilic modified layer S1 is formed on the surface of the interlayer insulating layer 104 in the processing chamber 240B, the Mn oxide layer S2 is formed in the processing chamber 240C. Therefore, the Mn oxide layer S2 can be efficiently formed on the surface of the interlayer insulating layer 104 (the modified layer S1) including the via hole 104*h* and the trench 104*t*. In addition, since the modified layer S1 is formed on the surface of the interlayer insulating layer 104, it is possible to prevent a Mn precursor as a precursor of the Mn oxide layer S2 from permeating into the interlayer insulating layer 104, thereby preventing an increase in the relative dielectric constant of the interlayer insulating layer 104.

In addition, in the case of CVD, an amount of deposition of the Mn oxide layer S2 can be increased since a —OH group or a Si—O—Si bond is formed by attaching water vapor or oxygen to the surface of the interlayer insulating layer 104 by introducing an oxygen-containing gas such as water (vapor) or the like into the processing chamber 240C and exposing the wafer W to an oxygen-containing gas atmosphere before forming the Mn oxide layer S2. In addition, this attachment process may be performed in the processing chamber 240B rather than the processing chamber 240C or may be performed by exposing the wafer W to an atmosphere having a certain humidity.

In addition, since the process temperature of the degassing process in the processing chamber 240A is set to be higher than the process temperature in the processing chamber 240C, it is possible to stabilize the thickness of the Mn oxide layer S2 formed in the processing chamber 240C.

In addition, although this embodiment has been described with Mn as metal, the present disclosure is not limited thereto. For example, metal elements used to form silicate may include one or more selected from a group consisting of Mg, Al, Ca, Ti, V, Fe, Co, Ni, Sr, Y, Zr, Ba, Hf and Ta.

In addition, although a workpiece has been here illustrated with a semiconductor wafer, this semiconductor wafer may include a silicon substrate and a compound semiconductor substrate such as GaAs, SiC, GaN and the like and further the present disclosure can be also applied to a glass substrate, a ceramic substrate and the like used for a liquid crystal display apparatus. In addition, a semiconductor device having a structure formed by the above-described film forming method of the present disclosure and an electronic apparatus including the semiconductor device falls within the scope of the disclosure.

In addition, the seed layer forming process performed in the processing chamber 240E is used to form a Cu wiring or the like on the Mn silicate layer 105 and is not a process essential to the present disclosure. That is, the processing chamber 240E included in the semiconductor manufacturing apparatus 200 is not essential and the semiconductor manufacturing apparatus 200 may have a configuration without the processing chamber 240E. In this case, a process up to the formation of the Mn silicate layer 105 is performed in the semiconductor manufacturing apparatus 200 and thereafter, the Cu film 106 as a seed layer is formed on the Mn silicate layer 105.

However, when the processing chamber 240E is included in the semiconductor manufacturing apparatus 200, the Cu film 106 as the seed layer can be formed on the Mn silicate layer 105 without exposing the Mn silicate layer 105 to the air. This can result in improved adhesion between the Mn silicate layer 105 and the Cu film 106 as the seed layer. In addition, the processing chamber 240D and the processing chamber 240E are both a vacuum apparatus and may be formed as a cluster tool docked to the same transfer chamber, rather than standalone, which can result in reduction of device occupying area (footprint) and costs.

In addition, in the above-described flow, as shown in Steps S104 and S105 of FIG. 5A, the Cu film 106 as the seed layer is formed on the Mn silicate layer 105 after the Mn oxide layer S2 is turned to silicate to form the Mn silicate layer 105. However, even when the Cu layer 106 is formed on the Mn oxide layer, since atoms of a reducing gas (particularly, hydrogen atoms) are small, it is considered that the atoms pass/diffuse through the Cu layer 106 (mainly a crystal grain boundary thereof) and arrive at the Mn oxide layer S2, thereby making the Mn oxide layer S2 silicate.

Therefore, as shown in FIG. 5B, with the reversed order of Steps S104 and S105 of FIG. 5A, the Mn oxide layer S2 may be turned to silicate to form the Mn silicate layer 105 after the Cu film 106 as the seed layer is formed on the Mn silicate layer 105.

In addition, as shown in FIG. 5C, after the order of Steps S104 and S105 is reversed, Step S106 of performing the Cu plating may be inserted between Steps S105 and S104. In this case, after the Cu film 106 as the seed layer is formed on the Mn oxide layer S2, the Cu plating may be performed on the Cu film 106 and then the Mn oxide layer S2 may be turned to silicate to form the Mn silicate layer 105.

In addition, in FIGS. 5A to 5C, the order of Steps S101 and S102 may be reversed. That is, after the surface modifying treatment of Step S102, the degassing process of Step S101 may be performed and then the Mn oxide layer forming process of Step S103 may be performed. If the insulating layer is exposed to the air after Step S101, the effect of the degassing process is lost as water in the air is adsorbed on the surface of the insulating layer. Therefore, there is a need to perform continuous processing in the same system without exposure to the air between Step S101 and Step S103.

On the other hand, between Steps S102 and S103 or between Steps S102 and S101, it is not always necessary to perform continuous processing in the same system. An exposure of the surface of the insulating layer to the air on the way of processing has no influence on the effects of the present disclosure. Thus, connection of the transfer chamber 230 and the processing chamber 240B is not essential to the configuration of the semiconductor manufacturing apparatus 200 but the processing chamber 240B may be provided as a separate device from the transfer chamber 230 regarding a configuration of the semiconductor manufacturing apparatus 200. In Examples 1 and Example 4 described later, processing flows of the above-described order are performed in an apparatus configuration where the processing chamber 240B is separate from the transfer chamber 230.

The present disclosure will now be described in more detail by way of Examples.

EXAMPLE 1

The present inventors formed a Low-k layer (insulating layer) using a CVD method and then formed a Mn oxide (MnOx) layer on the surface of the Low-k layer. The Mn oxide layer was formed on a hydrophobic Low-k layer subjected to no surface modifying treatment and a hydrophilic Low-k layer subjected to surface modifying treatment and a deposition rate of the Mn oxide layer in hydrophobicity and hydrophilicity was measured.

A plurality of wafers W were prepared, in each of which a SiOC film (having a relative dielectric constant of about 2.4) containing methyl groups, which is one of Low-k materials (having a relative dielectric constant of less than 4.1), was formed as an insulating layer and then its front surface was slightly cut by RIE (Reactive Ion Etching). Next, some wafers W were subjected to hydrophilization processing such as the above-described plasma processing, as a surface modifying treatment, while other wafers W being subjected to no surface modifying treatment, and then Mn oxide (MnOx) was formed on each of the wafers W by subjecting each wafer W to the above-described MnOx film-forming process.

In addition, in Example 1, three types of hydrophilization processings were compared, including, first, hydrogen radical processing at low power (1000 W) by remote plasma, second, hydrogen radical processing at high power (2500 W) by remote plasma, and third, oxygen plasma processing, all of which were performed for 60 seconds. In addition, the Mn oxide layer was formed by an ALD method. The Mn oxide layer was formed under process conditions of wafer temperature: 130 degrees C., flow rate of $N_2$ carrier gas: 25 sccm, flow rate of Mn precursor $(EtCp)_2Mn$: 8 sccm and flow rate of reactive gas $H_2O$: 1 sccm. The ALD was performed by performing a combination of Mn precursor irradiation step of 5 seconds and reactive gas irradiation step of 5 seconds a predetermined number of times, with an inert gas $N_2$ purging step interposed therebetween. Here, a Mn precursor bottle, a $H_2O$ bottle and a processing chamber were heated and maintained at 80 degrees C., 40 degrees C. and 80 degrees C., respectively. The wafers W were subjected to degassing at the wafer temperature of 270 degrees C. for 90 seconds before formation of the Mn oxide layer in order to degas excessive water and organic substances adsorbed on the interlayer insulating layer.

Figure 6:
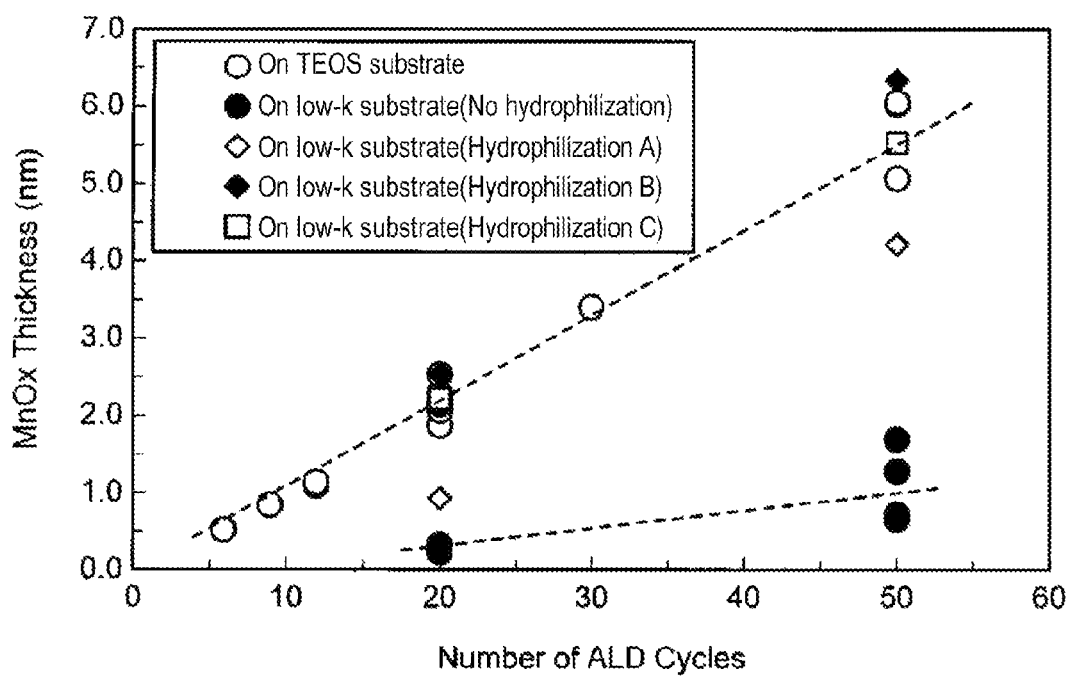
FIG. 6 is a graph showing a relationship between plasma processing and XRF film thickness (MnOx equivalent).

FIG. 6 is a graph showing a relationship between a film forming cycle (number of times) and a film thickness (MnOx equivalent) by the ALD method. The film thickness was measured by means of XRF (X-ray Fluorescence Analysis). Here, in addition to the above-described three types of processing as the hydrophilization processing, an example using a TEOS substrate having a hydrophilic surface was together plotted for comparison purpose. It can be seen from the results shown in FIG. 6 that a deposition rate for the remote plasma-based high power (2500 W) hydrogen radical processing (indicated by black diamond ♦, hydrophilization processing B) and a deposition rate for the oxygen plasma processing (indicated by white square □, hydrophilization processing C) are apparently higher (by about five times) than a deposition rate for no hydrophilization processing (indicated by black circle ●, no hydrophilization processing), which are comparable to a deposition rate for the TEOS substrate having the hydrophilic surface (indicated by white circle ○). In addition, it can be seen that a degree of hydrophilization increases with an increase in input power for processing since the effect by the remote plasma-based low power (1000 W) hydrogen radical processing (indicated by white diamond ◇, hydrophilization processing A) is limited as compared to the high power (2500 W) case.

EXAMPLE 2

Next, a plurality of samples in which Mn oxide (MnOx) layers having different thicknesses were formed on surfaces of insulating layers (TEOS films) was prepared. Thereafter, Cu film was deposited on the Mn oxide layer of the respective samples and then the plurality of sample was divided into two groups, one of which was subjected to annealing by introducing hydrogen thereinto. It is known from the above description that samples subjected to no reducing annealing are in a state of Mn oxide and samples subjected to reducing annealing are in a state of Mn silicate. Finally, an accelerated load test (annealing under application of voltage) was performed to measure Cu diffusivity for the samples.

In addition, in Example 2, the Mn oxide layer was formed by an ALD method and a CVD method. The process conditions for the ALD method were the same as Example 1. The process conditions for the CVD method were as follows: wafer temperature: 200 degrees C., pressure: 133 Pa, flow rate of $N_2$ carrier gas: 30 sccm, and flow rate of Mn precursor $(EtCp)_2Mn$: 5 sccm. At that point, the Mn oxide layer composition was mainly $Mn_2O_3$. Cu was deposited by a PVD method. In addition, the process conditions for hydrogen annealing were as follows: temperature: 400 degrees C., pressure: 267 Pa, and annealing time: 30 minutes. In addition, as the conditions for an accelerated load test, the sample were subjected to annealing with application of a voltage of 25 V at 200 degrees C. for 30 minutes (pressure: the almost air atmosphere).

Figure 7:
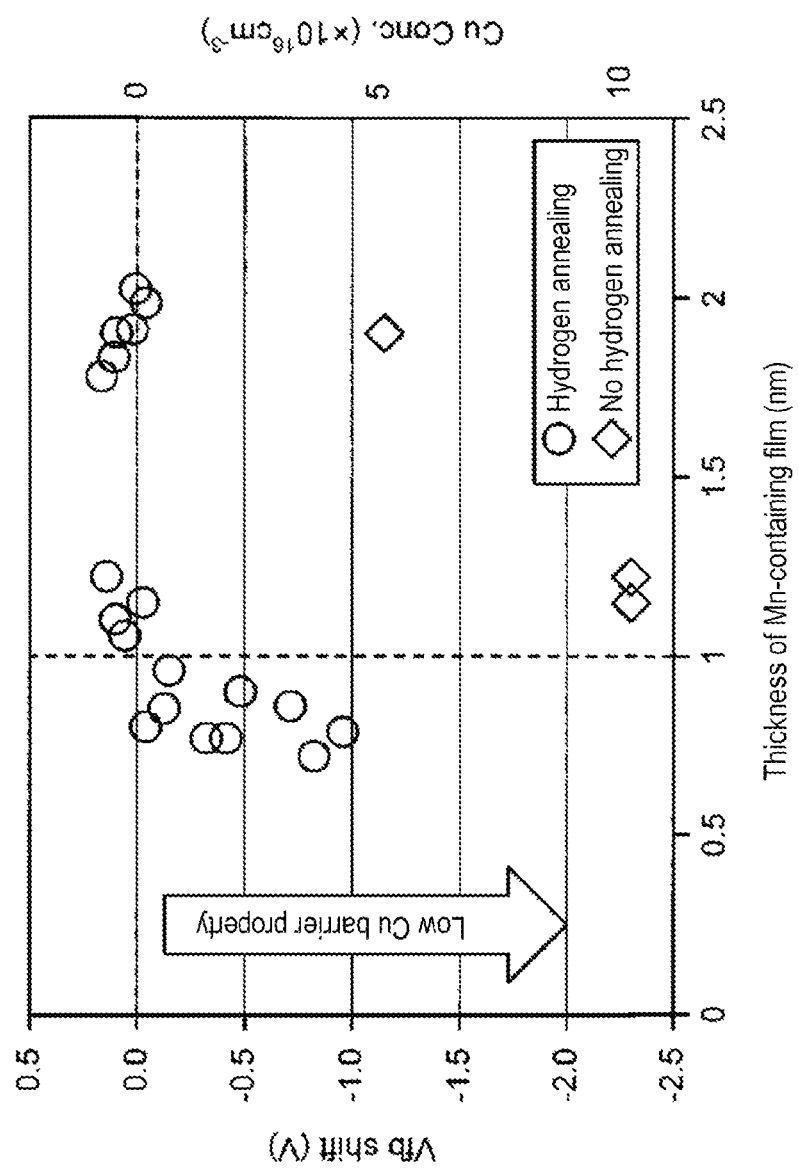
FIG. 7 is a graph showing the ability of a Mn-containing barrier layer as a Cu diffusion barrier and results of an analysis on elements at particular positions of an insulating layer.

FIG. 7 is a graph showing results of analysis on elements at particular positions of an insulating layer (near a boundary between the insulating layer and a Mn oxide layer (or Mn silicate layer)), in which samples prepared by an ALD method and samples prepared by a CVD method are plotted together with no distinction. In FIG. 7, the right vertical axis represents the number of Cu atoms/cm³ and the left vertical axis represents a shift (Vfb) of a flat band voltage obtained from capacitance-voltage measurement, corresponding to the number of Cu atoms/cm³ in the right vertical axis. In FIG. 7, the horizontal axis represents a film thickness of Mn oxide (or Mn silicate) deposited on an insulating layer.

It can be seen from FIG. 7 that, for no hydrogen annealing (indicated by ◇), $1.0 \times 10^{17}$ Cu atoms/cm³ exist for a thickness of 1 nm of the Mn oxide layer. It can be also seen that $5 \times 10^{16}$ Cu atoms/cm³ exist for a thickness of about 2 nm of the Mn oxide layer, which is still dense.

On the other hand, it can be seen that, for hydrogen annealing (indicated by ○), the number of Cu atoms/cm³ decreases rapidly with an increase in the thickness of the Mn silicate layer and is too small to be measured if the thickness of the Mn silicate layer exceeds 1 nm, showing that hardly any Cu atoms diffused into the insulating layer.

It can be seen from the results of Example 2 that the Mn silicate layer turned to silicate from Mn oxide through the annealing under a reducing atmosphere has a sufficient barrier property.

EXAMPLE 3

It is known from the above description that the sample subjected to no reducing annealing is in a state of Mn oxide and the sample subjected to reducing annealing is in a state of Mn silicate. In order to confirm this, in Example 3, using hydrogen as a reducing gas, XPS (X-ray Photoelectron Spectroscopy) measurement in a binding energy range of Si 2p and a binding energy range of O 1s and waveform separation analysis by curve fitting were made.

A plurality of samples in which an Mn oxide (MnOx) layer were formed on surfaces of insulating layers (TEOS films) was prepared. The samples were divided into three groups and were processed as follows.
(Group 1)

Hydrogen of the 3% concentration (the remaining being argon (Ar)) was introduced and the annealing processing was performed at 400 degrees C. for 10 minutes.

(Group 2)

Without hydrogen, under the 100% nitrogen ($N_2$) atmosphere, annealing processing was performed at 400 degrees C. for 10 minutes.

(Group 3)

No annealing process was performed. In Example 3, a Mn oxide layer was formed by an ALD method. The process conditions for the ALD method were the same as Example 1 and the number of film forming cycles was set to 20.

Figure 8A:
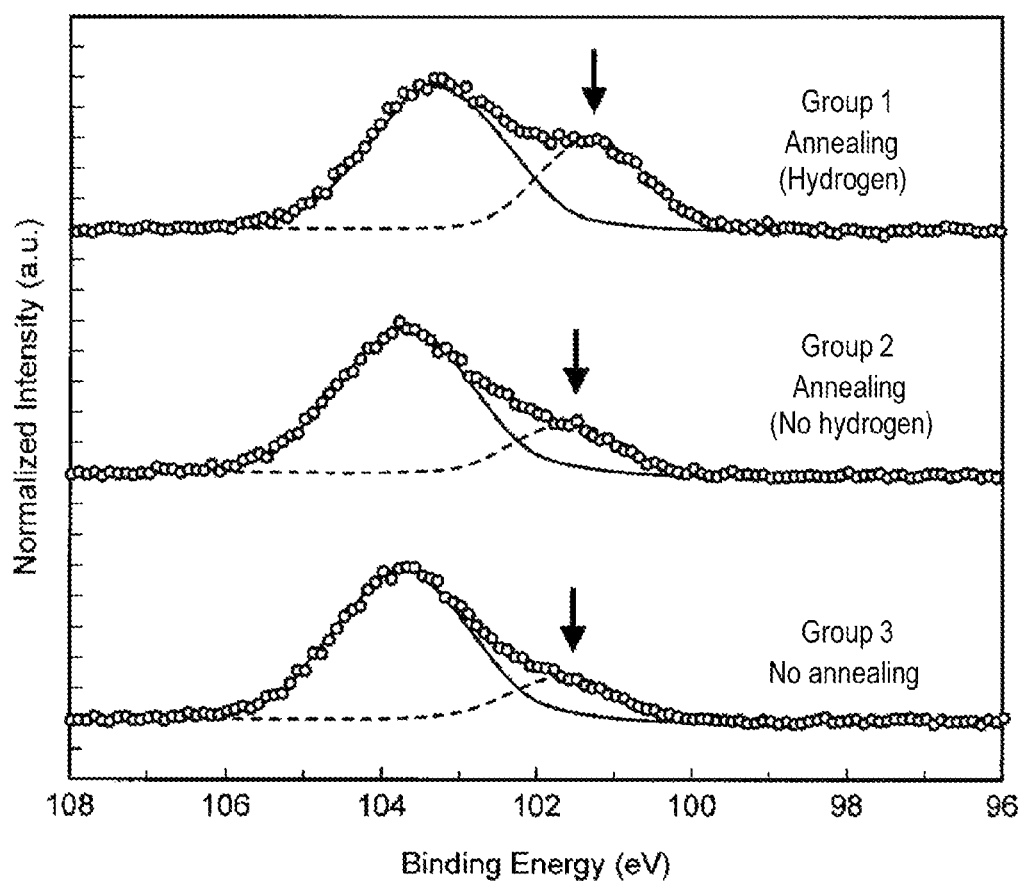
FIG. 8A is a graph showing results of waveform separation analysis on XPS measurement data by curve fitting in a binding energy range of Si 2p.
Figure 8B:
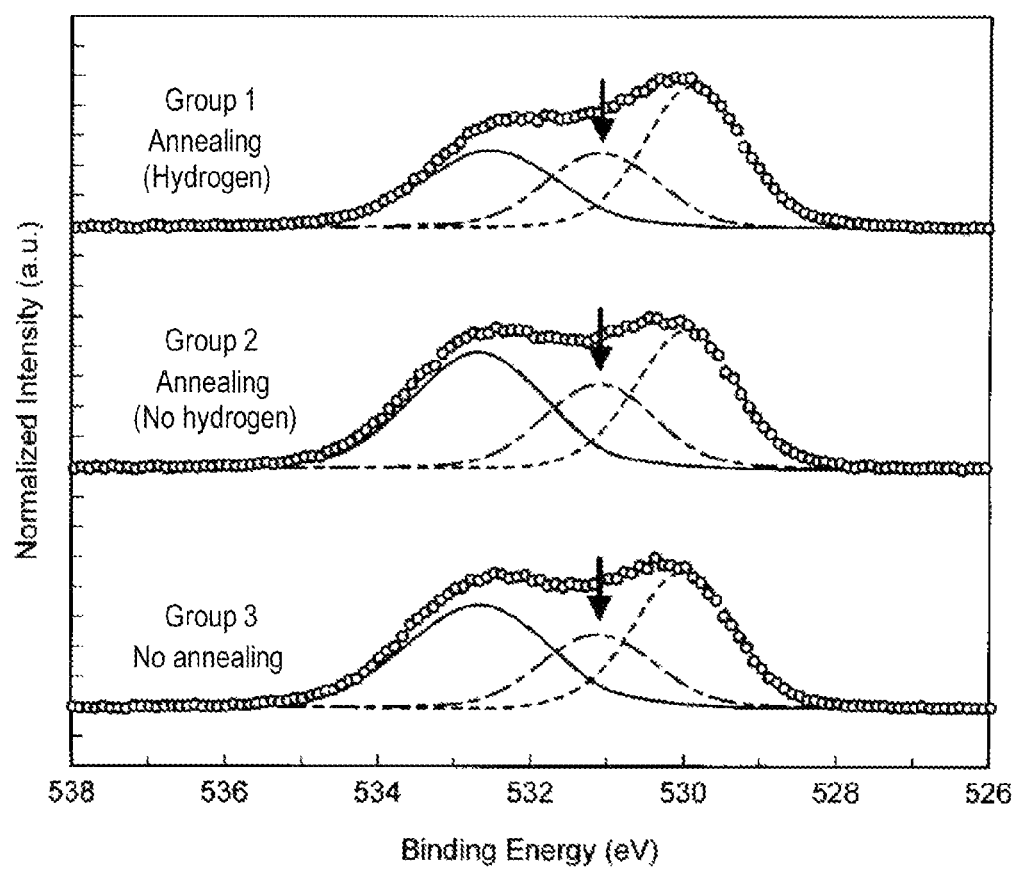
FIG. 8B is a graph showing results of waveform separation analysis on XPS measurement data by curve fitting in a binding energy range of O 1s.

FIGS. 8A and 8B are graphs showing results of waveform separation analysis on XPS measurement data by curve fitting in a binding energy range of Si 2p and a binding energy range of O 1s. FIGS. 8A and 8B show data obtained by measuring the above-mentioned three group samples by XPS, in which the data are arranged in the order of Group 1, Group 2 and Group 3 from above. In the graphs, the measured data are plotted by white circles (○) and results of waveform separation are plotted by solid lines, dashed lines and dashed-dotted lines. In FIGS. 8A and 8B, the vertical axis represents normalized XPS signal intensity and the horizontal axis represents chemical binding energy.

As the result of waveform separation, it is observed from FIG. 8A that any three samples have two peaks. The peak in the left side (higher energy side) of FIG. 8A is located at a position of binding energy of 103 to 104 eV. This corresponds to $SiO_2$ binding energy and accordingly means a signal derived from an underlying insulating layer (TEOS film). On the other hand, the peaks indicated by arrows ↓ in the right side (lower energy side) of FIG. 8A are located at a position of binding energy of 101 to 102 eV. This corresponds to Mn silicate binding energy.

Even the samples (Group 3) subjected to no annealing process have peaks derived from the Mn silicate. In this regard, it is considered that the Mn silicate was formed by reaction of at least a portion of Mn oxide formed by the ALD method with underlying $SiO_2$ at the point of formation of the Mn oxide. Although the peaks derived from the Mn silicate are observed from the samples (Group 2) annealed without hydrogen, the peak intensity thereof is substantially equal to that of the samples subjected to no annealing process. It can be seen from this that formation of the Mn silicate did not proceed much in the annealing process without hydrogen. On the contrary, it is clear that the intensity of the peak (on the right side) derived from the Mn silicate observed in the samples (Group 1) annealed with hydrogen is twice or more as high as those of the other two samples, which means that formation of the Mn silicate is promoted by the annealing processing with hydrogen.

On the other hand, as the result of waveform separation, it is observed from FIG. 8B that any three samples have three peaks. The peak on the left side (higher energy side) of FIG. 8B is located near a binding energy of 533 eV. This corresponds to the $SiO_2$ binding energy and accordingly means a signal is derived from an underlying insulating layer (TEOS film). On the other hand, the peak indicated by an arrow ↓ around the center of FIG. 8B is located near a binding energy of 531 eV. This corresponds to the binding energy of Mn silicate and Mn—OH. In addition, the peak on the right side (lower energy side) of FIG. 8B is located near a binding energy of 530 eV. This corresponds to Mn—O binding energy and accordingly means a signal derived from a deposited Mn oxide.

Even for the samples (Group 3) subjected to no annealing processing, peaks derived from the Mn silicate and Mn—OH are shown. In this regard, referring to the results of FIG. 8A together, it is considered that the Mn silicate is formed by reaction of at least a portion of Mn oxide formed by the ALD method with underlying $SiO_2$ at the point of formation of the Mn oxide. Although the peaks (the peak near the center of FIG. 8B) derived from the Mn silicate are observed from the samples (Group 2) annealed without hydrogen, their peak intensity is substantially equal to that of the samples subjected to no annealing processing and is lower than the $SiO_2$ peak intensity in the left side of FIG. 8B. It can be seen from this that formation of the Mn silicate did not proceed much in the annealing processing without hydrogen. On the contrary, the intensity of peak derived from the Mn silicate (including Mn—OH) observed in the samples (Group 1) annealed with hydrogen is substantially equal to the $SiO_2$ peak intensity in the left side of FIG. 8B, from which it is considered that the Mn silicate is increased while $SiO_2$ being decreased. From the above, it is clear that the formation of the Mn silicate is promoted by the annealing process with introduction of hydrogen.

It could be confirmed from the results of Example 3 that annealing processing under a reducing atmosphere was very effective in forming Mn silicate by reaction of deposited Mn oxide with underlying $SiO_2$.

EXAMPLE 4

Next, in order to examine an effect of surface modifying treatment and annealing processing on adhesion, a stacked structure of Cu layer/Mn oxide layer/insulating layer (TEOS or Low-k layer) simulating an actual structure of a semiconductor device was prepared and film peeling-off strength, i.e., adhesion strength, was calculated and compared from fracture toughness strength obtained by m-ELT (modified-Edge Lift off Test). In Example 4, a Mn oxide layer was formed by an ALD method. The process conditions for the ALD method were the same as Example 1 and the number of film forming cycles was set to 20.

Two wafers were prepared, in each of which a SiOC film (having a relative dielectric constant of about 2.4), which is one of Low-k materials, was formed as an insulating layer and its front surface was slightly cut by RIE. Next, one wafer W was subjected to hydrophilization processing such as the above-described oxygen plasma processing, as a surface modifying treatment, while the other wafer W was subjected to no surface modifying treatment, and then Mn oxide (MnOx) was formed on each of the wafers W by subjecting each wafer W to the above-described MnOx film-forming process.

In addition, in Example, 4, two wafers W on which a TEOS film having a hydrophilic surface was formed as an insulating film were prepared and the above-described stacked structures of Cu layer/Mn oxide layer/insulating layer (TEOS layer) were formed. Next, one wafer W was subjected to hydrogen-free annealing processing at 400 degrees C. for 10 minutes under a 100% nitrogen ($N_2$) atmosphere and the other wafer W was subjected to no surface modifying treatment.

Figure 9:
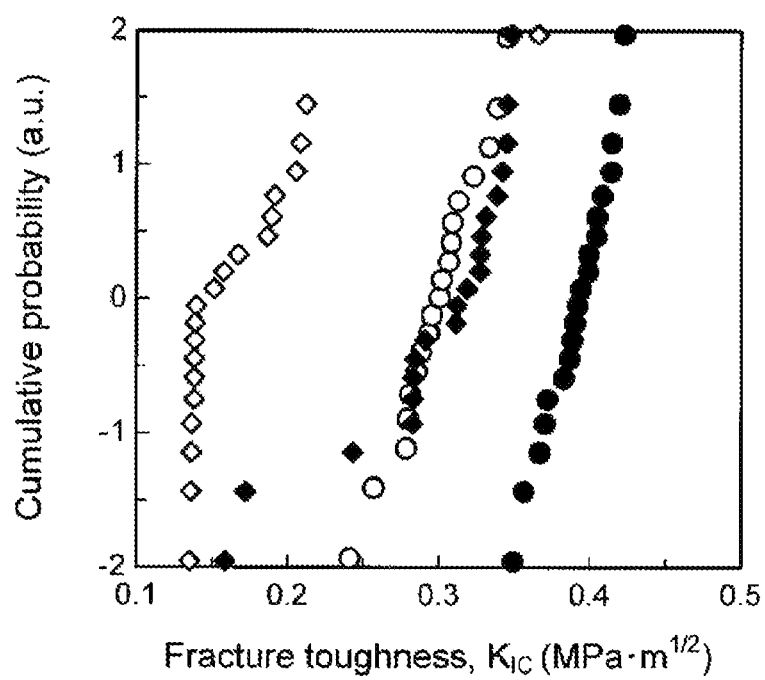
FIG. 9 is a graph showing results of evaluation on adhesion strength of a stacked structure of a Cu layer/Mn oxide layer/insulating layer, measured by an m-ELT method.

FIG. 9 is a graph showing results of evaluation on adhesion strength of the prepared stacked structure of Cu layer/Mn oxide layer/insulating layer, measured by the m-ELT method. FIG. 9 shows film peeling-off strength, i.e., adhesion strength, calculated from fracture toughness strength. In FIG. 9, for one condition, adhesion strength of about 20 chip samples cut from the same wafer W was measured and was plotted with logarithm of accumulative probability.

It can be seen from the results shown in FIG. 9 that an average of adhesion strength for a Low-k film surface subjected to no hydrophilization (indicated by a white diamond ◇) is only about 0.17 $MPa \cdot m^{1/2}$. On the contrary, it can be seen that an average of adhesion strength for a Low-k film surface subjected to hydrophilization (indicated by a black diamond ♦) is increased to about 0.3 MPa·m$^{1/2}$.

In addition, it can be seen from the results shown in FIG. 9 that an average of adhesion strength for a stacked structure of Cu layer/Mn oxide layer/insulating layer (TEOS layer) subjected to no annealing (indicated by white circle ○) is about 0.3 MPa·m$^{1/2}$. On the contrary, it can be seen that an average of adhesion strength for a stacked structure of Cu layer/Mn oxide layer/insulating layer (TEOS layer) subjected to annealing (indicated by a black circle ●) is increased to about 0.4 MPa·m$^{1/2}$.

It can be seen from the results of Example 4 that forming a Mn oxide layer after subjecting a Low-k layer surface to hydrophilization is effective in increasing adhesion strength of a structure of Cu layer/Mn oxide layer/Low-k layer. In addition, since adhesion can be increasingly enhanced by performing the annealing after forming the structure of Cu layer/Mn oxide layer/TEOS layer, a similar enhancement of adhesion by the annealing can be expected for the structure of Cu layer/Mn oxide layer/Low-k layer. In addition, since the Mn silicate is formed through the reaction of Mn oxide with an underlying SiO$_2$ through addition of a reducing gas in the annealing, further enhancement of adhesion by a chemical reaction can be expected.

It is known that adhesion strength required for manufacture of semiconductor devices is about 0.3 MPa·m$^{1/2}$. If the adhesion strength is smaller than this value, there is a possibility of film peeling-off during manufacture of semiconductor devices. However, when the present disclosure is applied to the manufacture of semiconductor devices, since the adhesion strength can be increased to over 0.3 MPa·m$^{1/2}$, it is possible to prevent films from being peeled off during the manufacture of semiconductor devices, which can result in improvement of product yield.

According to the present disclosure, it is possible to provide a method for manufacturing a semiconductor device, which is capable of forming a silicate layer on a surface of an insulating layer having a small relative dielectric constant with high efficiency, a semiconductor device, and a semiconductor manufacturing apparatus.

The semiconductor device, the method for manufacturing the semiconductor device and the semiconductor manufacturing apparatus of the present disclosure can provide a semiconductor device including thinned wirings having low electrical resistance, a method for manufacturing the semiconductor device, and a semiconductor manufacturing apparatus, and thus has industrial applicability.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for manufacturing a semiconductor device for forming a metal element-containing layer on an insulating layer in which a concave portion is formed, comprising:
    forming an oxide layer including an oxide of the metal element on the insulating layer including the concave portion; and
    forming a silicate layer including a silicate of the metal element by making the oxide layer silicate by annealing under a reducing atmosphere,
    wherein the reducing atmosphere contains one or more selected from a group consisting of hydrogen, carbon monoxide, ammonia and hydrazine.

2. The method of claim 1, wherein the insulating layer contains silicon oxide (SiOx), and
    wherein the forming a silicate layer forms the silicate layer by causing the oxide layer to react with the silicon oxide (SiOx) contained in the insulating layer by the annealing.

3. The method of claim 1, wherein the annealing is performed within a range of 150 degrees C. to 600 degrees C.

4. The method of claim 1, wherein the annealing is performed within a range of 300 degrees C. to 450 degrees C.

5. The method of claim 1, further comprising: modifying a surface of the insulating layer before the forming an oxide layer.

6. The method of claim 1, wherein the oxide layer is formed by an ALD method in which forming a precursor adsorption layer as a precursor of the oxide layer and forming the precursor adsorption layer into the oxide layer by causing the precursor adsorption layer to react with an oxygen-containing gas are alternately repeated.

7. The method of claim 1, wherein the metal element is one or more selected from a group consisting of Mg, Al, Ca, Ti, V, Mn, Fe, Co, Ni, Sr, Y, Zr, Ba, Hf and Ta.

8. The method of claim 1, wherein the metal element-containing layer is formed by a Mn precursor and the Mn precursor is an organic metal material containing manganese, and
    wherein the organic metal material includes one or more organic compounds selected from a group consisting of:
    Cp$_2$Mn[=Mn(C$_5$H$_5$)$_2$],
    (MeCp)$_2$Mn[=Mn(CH$_3$C$_5$H$_4$)$_2$],
    (Me$_5$Cp)$_2$Mn[=Mn((CH$_3$)$_5$C$_5$H$_4$)$_2$],
    (EtCp)$_2$Mn[=Mn(C$_2$H$_5$C$_5$H$_4$)$_2$],
    (i-PrCp)$_2$Mn[=Mn(C$_3$H$_7$C$_5$H$_4$)$_2$],
    (t-BuCp)$_2$Mn[=Mn(C$_4$H$_9$C$_5$H$_4$)$_2$],
    MeCpMn(CO)$_3$[=(CH$_3$C$_5$H$_4$)Mn(CO)$_3$],
    CpMn(CO)$_3$ [=(C$_5$H$_5$)Mn(CO)$_3$],
    MeMn(CO)$_5$[=CH$_3$)Mn(CO)$_5$],
    Mn$_2$(CO)$_{10}$,
    3-(t-BuAllyl)Mn(C0)$_4$,
    Mn(DPM)$_2$[=Mn(C$_{11}$H$_{19}$O$_2$)$_2$],
    Mn(DPM)$_3$ [=Mn(C$_{11}$H$_{19}$O$_2$)$_3$],
    Mn(DMPD)(EtCp)[=Mn(C$_7$H$_{11}$C$_2$H$_5$C$_5$H$_4$)],
    Mn(acac)$_2$[=Mn(C$_5$H$_7$O$_2$)$_2$],
    Mn(acac)$_3$[=Mn(C$_5$H$_7$O$_2$)$_3$],
    Mn(hfac)$_2$[=Mn(C$_5$HF$_6$O$_2$)$_2$],
    Mn(hfac)$_3$ [=Mn(C$_5$HF$_6$O$_2$)$_3$],
    Mn(iPr-AMD)$_2$[=Mn(C$_3$H$_7$NC(CH$_3$)NC$_3$H$_7$)$_2$],
    Mn(tBu-AMD)$_2$[=Mn(C$_4$H$_9$NC(CH$_3$)NC$_4$H$_9$)$_2$], and
    Mn(R$^1$N-Z-NR$^2$$_2$)$_2$
    (where, R$^1$ and R$^2$ are alkyl groups represented by —C$_n$H$_{2n+1}$(n is an integer of 0 or more) and Z is an alkylene group represented by —C$_n$H$_{2n+1}$—(n is an integer of 0 or more)).

9. The method of claim 5, wherein the modifying a surface of the insulating layer includes decreasing carbon (C) from the surface of the insulating layer.

10. The method of claim 5, wherein the modifying a surface of the insulating layer includes hydrophilizing the surface of the insulating layer.

11. The method of claim 5, wherein the modifying a surface of the insulating layer including densifying the surface of the insulating layer.

12. The method of claim 5, wherein the insulating layer is a porous body having a plurality of pores, and
wherein the modifying a surface of the insulating layer includes reducing the diameter of the pores and/or blocking the pores in the surface of the insulating layer.

13. The method of claim 5, wherein the modifying a surface of the insulating layer is performed by exposing the surface of the insulating layer to plasma.

14. The method of claim 5, wherein the modifying a surface of the insulating layer is performed by exposing the surface of the insulating layer to radicals derived from plasma.

15. The method of claim 5, further comprising degasing the insulating layer by heating the insulating layer to a temperature higher than a process temperature in the forming an oxide layer, before the modifying a surface of the insulating layer.

16. The method of claim 5, further comprising attaching water and/or an oxygen-containing gas to the surface of the insulating layer between the modifying a surface of the insulating layer and the forming an oxide layer.

17. The method of claim 6, wherein the oxygen-containing gas includes one or more selected from a group consisting of $H_2O$, $N_2O_5$ $NO_2$, NO, $O_2$, $O_3$, $H_2O_2$, CO, $CO_2$, alcohols, aldehydes, carboxylic acids, carboxylic anhydrides, esters, organic acid ammonium salts, organic acid amine salts, organic acid amides and organic acid hydrazides.

18. The method of claim 7, wherein the metal element is Mn.

19. A semiconductor device including an insulating layer in which a concave portion is formed, and a metal element-containing layer formed on the insulating layer, wherein an oxide layer including mainly an oxide of the metal element is formed on the insulating layer including the concave portion, and a silicate layer including mainly a silicate of the metal element is formed by making the oxide layer silicate by annealing under a reducing atmosphere,
wherein the reducing atmosphere contains one or more selected from a group consisting of hydrogen, carbon monoxide, ammonia and hydrazine.

20. The semiconductor device of claim 19, wherein the insulating layer contains silicon oxide (SiOx), and
wherein the silicate layer is formed by reaction of the oxide layer with the silicon oxide (SiOx) contained in the insulating layer.

21. The semiconductor device of claim 19, wherein the insulating layer contains less carbon (C) in the surface of the insulating layer than in the inside of the insulating layer.

22. The semiconductor device of claim 19, wherein the insulating layer has a higher density in the surface of the insulating layer than in the inside of the insulating layer.

23. The semiconductor device of claim 19, wherein the insulating layer is a porous body having a plurality of pores and the pores in the surface of the insulating layer are smaller in diameter and/or in number than in the inside of the insulating layer.

24. The semiconductor device of claim 19, wherein the oxide layer is formed by an ALD method in which forming a precursor adsorption layer as a precursor of the oxide layer and forming the precursor adsorption layer into the oxide layer by causing the precursor adsorption layer to react with an oxygen-containing gas are alternately repeated.

25. The semiconductor device of claim 19, wherein the oxide layer is formed after attaching water and/or an oxygen-containing gas to the surface of the insulating layer.

26. The semiconductor device of claim 19, wherein the metal element is one or more selected from a group consisting of Mg, Al, Ca, Ti, V, Mn, Fe, Co, Ni, Sr, Y, Zr, Ba, Hf and Ta.

27. The semiconductor device of claim 26, wherein the metal element is Mn.

28. A semiconductor manufacturing apparatus for forming a metal element-containing layer on an insulating layer in which a concave portion is formed, comprising:
a first processing chamber in which an oxide layer including mainly an oxide of the metal element is formed on the insulating layer including the concave portion; and
a second processing chamber in which a silicate layer including mainly a silicate of the metal element is formed by making the oxide layer silicate by annealing under a reducing atmosphere,
wherein the reducing atmosphere contains one or more selected from a group consisting of hydrogen, carbon monoxide, ammonia and hydrazine.

29. The semiconductor manufacturing apparatus of claim 28, wherein the insulating layer contains silicon oxide (SiOx), and
wherein, in the second processing chamber, the silicate layer is formed by a reaction of the oxide layer with the silicon oxide (SiOx) contained in the insulating layer.

30. The semiconductor manufacturing apparatus of claim 28, wherein, in the second processing chamber, the annealing is performed within a range of 150 degrees C. to 600 degrees C.

31. The semiconductor manufacturing apparatus of claim 28, further comprising a third processing chamber in which a surface of the insulating layer is modified before the oxide layer is formed.

32. The semiconductor manufacturing apparatus of claim 28, wherein the first processing chamber is an ALD chamber in which forming a precursor adsorption layer as a precursor of the oxide layer and forming the precursor adsorption layer into the oxide layer by causing the precursor adsorption layer to react with an oxygen-containing gas are repeated alternately.

33. The semiconductor manufacturing apparatus of claim 28, wherein, in the first processing chamber, water and/or an oxygen-containing gas are attached to the surface of the insulating layer between modifying the surface of the insulating layer and forming the oxide layer.

34. The semiconductor manufacturing apparatus of claim 28, wherein the metal element is one or more selected from a group consisting of Mg, Al, Ca, Ti, V, Mn, Fe, Co, Ni, Sr, Y, Zr, Ba, Hf and Ta.

35. The semiconductor manufacturing apparatus of claim 28, wherein the oxide layer is formed by a Mn precursor and the Mn precursor is an organic metal material containing manganese, and
wherein the organic metal material includes one or more organic compounds selected from a group consisting of:
$Cp_2Mn[=Mn(C_5H_5)_2]$,
$(MeCp)_2Mn[=Mn(CH_3C_5H_4)_2]$,
$(Me_5Cp)_2Mn[=Mn((CH_3)_5C_5H_4)_2]$,
$(EtCp)_2Mn[=Mn(C_2H_5C_5H_4)_2]$,
$(i-PrCp)_2Mn[=Mn(C_3H_7C_5H_4)_2]$,
$(t-BUC_P)_2Mn[=Mn(C_4H_9C_5H_4)_2]$,
$MeCpMn(CO)_3[=CH_3C_5H_4)Mn(CO)_3]$,
$CpMn(CO)_3 [=(C_5H_5)Mn(CO)_3]$,
$MeMn(CO)_5[=CH_3)Mn(CO)_5]$,
$Mn_2(CO)_{10}$,
3-(t-BuAllyl)$Mn(CO)_4$,
$Mn(DPM)_2[=Mn(C_{11}H_{19}O_2)_2]$,
$Mn(DPM)_3 [=Mn(C_{11}H_{19}O_2)_3]$, Mn(DMPD)(EtCp)[=Mn($C_7H_{11}C_2H_5C_5H_4$)],
Mn(acac)$_2$[=Mn($C_5H_7O_2$)$_2$],
Mn(acac)$_3$[=Mn($C_5H_7O_2$)$_3$],
Mn(hfac)$_2$[=Mn($C_5HF_6O_2$)$_2$]$_5$
Mn(hfac)$_3$ [=Mn($C_5^1E_6O_2$)$_3$]$_5$
Mn(iPr-AMD)$_2$[=Mn($C_3H_7NC(CH_3)NC_3H_7$)$_2$],
Mn(tBu-AMD)$_2$[=Mn($C_4H_9NC(CH_3)NC_4H_9$)$_2$], and
Mn($R^1$N-Z-N$R^2_2$)$_2$ (where, $R^1$ and $R^2$ are alkyl groups represented by —$C_nH_{2n+1}$(n is an integer of 0 or more) and Z is an alkylene group represented by —$C_nH_{2n+1}$—(n is an integer of 0 or more)).

36. The semiconductor manufacturing apparatus of claim 31, wherein, in the third processing chamber, carbon (C) is decreased from the surface of the insulating layer.

37. The semiconductor manufacturing apparatus of claim 31, wherein, in the third processing chamber, the surface of the insulating layer is hydrophilized.

38. The semiconductor manufacturing apparatus of claim 31, wherein, in the third processing chamber, the surface of the insulating layer is densified.

39. The semiconductor manufacturing apparatus of claim 31, wherein the insulating layer is a porous body having a plurality of pores, and
wherein, in the third processing chamber, the diameter of the pores in the surface of the insulating layer is reduced and/or the pores in the surface of the insulating layer are blocked.

40. The semiconductor manufacturing apparatus of claim 31, wherein, in the third processing chamber, the surface of the insulating layer is exposed to plasma.

41. The semiconductor manufacturing apparatus of claim 31, wherein, in the third processing chamber, the surface of the insulating layer is exposed to radicals derived from plasma.

42. The semiconductor manufacturing apparatus of claim 31, further comprising a fourth processing chamber in which, before the surface of the insulating layer is modified, the insulating layer is heated to a temperature higher than a process temperature in a process of forming the oxide layer.

43. The semiconductor manufacturing apparatus of claim 32, wherein the oxygen-containing gas includes one or more selected from a groups consisting of $H_2O$, $N_2O$, $NO_2$, NO, $O_2$, $O_3$, $H_2O_2$, CO, $CO_2$, alcohols, aldehydes, carboxylic acids, carboxylic anhydrides, esters, organic acid ammonium salts, organic acid amine salts, organic acid amides and organic acid hydrazides.

44. The semiconductor manufacturing apparatus of claim 34, wherein the metal element is Mn.

* * * * *